(12) United States Patent
Yamazaki

(10) Patent No.: US 12,170,317 B2
(45) Date of Patent: Dec. 17, 2024

(54) SEMICONDUCTOR DEVICE, AND METHOD OF MANUFACTURING THE SEMICONDUCTOR DEVICE

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 278 days.

(21) Appl. No.: 17/575,707

(22) Filed: Jan. 14, 2022

(65) Prior Publication Data

US 2022/0140090 A1 May 5, 2022

Related U.S. Application Data

(63) Continuation of application No. 16/618,831, filed as application No. PCT/IB2018/053629 on May 23, 2018, now Pat. No. 11,227,920.

(30) Foreign Application Priority Data

Jun. 5, 2017 (JP) .................. 2017-111144

(51) Int. Cl.
  *H10B 43/27* (2023.01)
  *H01L 29/24* (2006.01)

(52) U.S. Cl.
  CPC ............ *H01L 29/24* (2013.01); *H10B 43/27* (2023.02)

(58) Field of Classification Search
  CPC ....................................... H10B 43/27
  See application file for complete search history.

(56) References Cited

U.S. PATENT DOCUMENTS

| | | |
|---|---|---|
| 8,952,377 B2 | 2/2015 | Yamazaki et al. |
| 9,166,055 B2 | 10/2015 | Yamazaki et al. |
| 9,196,745 B2 | 11/2015 | Yamazaki et al. |

(Continued)

FOREIGN PATENT DOCUMENTS

| | | |
|---|---|---|
| JP | 2013-021312 A | 1/2013 |
| JP | 2013-038399 A | 2/2013 |

(Continued)

OTHER PUBLICATIONS

Chinese Office Action (Application No. 201880037249.6) Dated Feb. 15, 2023.

(Continued)

*Primary Examiner* — Christopher A Johnson
(74) *Attorney, Agent, or Firm* — Fish & Richardson P.C.

(57) ABSTRACT

A semiconductor device having a large storage capacity per unit area is provided. The semiconductor device includes a memory transistor. The memory transistor includes a conductor including an opening, a first insulator provided in contact with an inner side of the opening, a second insulator provided in contact with an inner side of the first insulator, a third insulator provided in contact with an inner side of the second insulator, a first oxide provided in contact with an inner side of the third insulator, and a second oxide provided in contact with an inner side of the first oxide. An energy gap of the second oxide is narrower than an energy gap of the first oxide.

20 Claims, 24 Drawing Sheets

(56) References Cited

U.S. PATENT DOCUMENTS

| | | |
|---|---|---|
| 9,502,431 B2 | 11/2016 | Sakuma et al. |
| 9,530,897 B2 | 12/2016 | Yamazaki et al. |
| 9,634,097 B2 | 4/2017 | Rabkin et al. |
| 9,761,732 B2 | 9/2017 | Nomura et al. |
| 9,780,170 B2 | 10/2017 | Ota et al. |
| 9,882,059 B2 | 1/2018 | Yamazaki et al. |
| 10,043,918 B2 | 8/2018 | Yamazaki et al. |
| 10,374,097 B2 | 8/2019 | Yamazaki et al. |
| 10,658,522 B2 | 5/2020 | Yamazaki et al. |
| 10,693,013 B2 | 6/2020 | Toriumi et al. |
| 10,944,014 B2 | 3/2021 | Yamazaki et al. |
| 11,011,652 B2 | 5/2021 | Yamazaki et al. |
| 11,217,703 B2 | 1/2022 | Toriumi et al. |
| 2011/0065270 A1 | 3/2011 | Shim et al. |
| 2012/0319114 A1 | 12/2012 | Yamazaki et al. |
| 2014/0014947 A1 | 1/2014 | Yamazaki |
| 2014/0027762 A1 | 1/2014 | Tsurume et al. |
| 2015/0255139 A1 | 9/2015 | Atsumi et al. |
| 2016/0149004 A1 | 5/2016 | Rabkin et al. |
| 2016/0247927 A1 | 8/2016 | Nomura et al. |
| 2016/0351576 A1 | 12/2016 | Yamazaki et al. |
| 2017/0040416 A1* | 2/2017 | Ota ........................ H10B 43/50 |
| 2017/0069765 A1 | 3/2017 | Yamazaki et al. |
| 2021/0242220 A1 | 8/2021 | Yamazaki et al. |
| 2021/0313473 A1 | 10/2021 | Yamazaki et al. |
| 2022/0037532 A1 | 2/2022 | Toriumi et al. |

FOREIGN PATENT DOCUMENTS

| | | | |
|---|---|---|---|
| JP | 2014-042013 A | | 3/2014 |
| JP | 2015-135961 A | | 7/2015 |
| JP | 2016-063027 A | | 4/2016 |
| JP | 2016-129239 A | | 7/2016 |
| JP | 2016-225614 A | | 12/2016 |
| JP | 2017-034144 A | | 2/2017 |
| JP | 2017-120921 A | | 7/2017 |
| KR | 20100133212 A | * | 12/2010 |
| WO | WO-2016/137668 | | 9/2016 |
| WO | WO-2016/166628 | | 10/2016 |
| WO | WO-2016/203341 | | 12/2016 |

OTHER PUBLICATIONS

International Search Report (Application No. PCT/IB2018/053629) Dated Aug. 7, 2018.

Written Opinion (Application No. PCT/IB2018/053629) Dated Aug. 7, 2018.

* cited by examiner

SEMICONDUCTOR DEVICE, AND METHOD OF MANUFACTURING THE SEMICONDUCTOR DEVICE

CROSS REFERENCE TO RELATED APPLICATIONS

This application is a continuation of U.S. application Ser. No. 16/618,831, filed Dec. 3, 2019, now allowed, which is incorporated by reference and is a U.S. National Phase Application under 35 U.S.C. § 371 of International Application PCT/IB2018/053629, filed on May 23, 2018, which is incorporated by reference, and which claims the benefit of a foreign priority application filed in Japan on Jun. 5, 2017, as Application No. 2017-111144.

TECHNICAL FIELD

The present invention relates to, for example, a memory device and a semiconductor device. Alternatively, the present invention relates to, for example, manufacturing methods of the memory device and the semiconductor device. Alternatively, the present invention relates to a memory transistor included in a memory device and a manufacturing method of the memory transistor. Alternatively, the present invention relates to, for example, a processor and an electronic device. Alternatively, the present invention relates to manufacturing methods of the processor and the electronic device. Alternatively, the present invention relates to driving methods of the memory device, the processor, and the electronic device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter.

Note that in this specification and the like, a semiconductor device refers to a device that can function by utilizing semiconductor characteristics in general. A display device, a light-emitting device, a lighting device, an electro-optical device, a memory device, a semiconductor circuit, and an electronic device include a semiconductor device in some cases.

BACKGROUND ART

In recent years, with the increase in the amount of data handled, a semiconductor device having a larger storage capacity has been required. To increase storage capacity per unit area, stacking and forming memory cells is effective (see Patent Document 1 and Patent Document 2). Stacking memory cells can increase storage capacity per unit area depending on the number of stacked memory cells.

PRIOR ART DOCUMENTS

Patent Documents

[Patent Document 1] United States Patent Application No. 2011/0065270A1
[Patent Document 2] U.S. Pat. No. 9,634,097B2

SUMMARY OF THE INVENTION

Problems to be Solved by the Invention

In Patent Document 1, a semiconductor pattern provided in a columnar form is in direct contact with an insulator including a charge accumulation layer. In Patent Document 2, a semiconductor pattern provided in a columnar form is in direct contact with an insulator functioning as a tunnel dielectric. When the semiconductor is in direct contact with the insulator, trap centers might be formed at the interface between them. The trap centers formed at the interface between the semiconductor and the insulator trap electrons and change the threshold voltage of the transistor in the positive direction and thus might adversely affect the current driving power in the on state of the transistor, that is, the on-state current, the field-effect mobility, and the reliability.

In view of the above problems, an object of one embodiment of the present invention is to provide a semiconductor device having favorable electrical characteristics in which the formation of trap centers is suppressed.

An object is to provide a semiconductor device having a large storage capacity per unit area. Alternatively, an object is to provide a semiconductor device having a novel structure in which memory cells (also referred to as memory transistors) are stacked. Alternatively, an object is to provide a semiconductor device having high productivity.

Alternatively, an object is to provide a module including the semiconductor device. Alternatively, an object is to provide an electronic device including the semiconductor device or the module. Alternatively, an object is to provide a novel semiconductor device. Alternatively, an object is to provide a novel module. Alternatively, an object is to provide a novel electronic device.

Note that the descriptions of these objects do not preclude the existence of other objects. One embodiment of the present invention does not need to achieve all the objects.

Other objects will be apparent from and can be derived from the description of the specification, the drawings, the claims, and the like.

Means for Solving the Problem

One embodiment of the present invention is a semiconductor device including a memory transistor. The memory transistor includes a conductor including an opening, a first insulator provided in contact with an inner side of the opening, a second insulator provided in contact with an inner side of the first insulator, a third insulator provided in contact with an inner side of the second insulator, a first oxide provided in contact with an inner side of the third insulator, and a second oxide provided in contact with an inner side of the first oxide. An energy gap of the second oxide is narrower than an energy gap of the first oxide.

Another embodiment of the present invention is a semiconductor device including a memory transistor. The memory transistor includes a conductor including an opening, a first insulator provided in contact with an inner side of the opening, a second insulator provided in contact with an inner side of the first insulator, a third insulator provided in contact with an inner side of the second insulator, a first oxide provided in contact with an inner side of the third insulator, a second oxide provided in contact with an inner side of the first oxide, and a third oxide provided in contact with an inner side of the second oxide. An energy gap of the second oxide is narrower than an energy gap of the first oxide, and an energy gap of the second oxide is narrower than an energy gap of the third oxide.

In the above, the first oxide and the second oxide preferably include In, an element M (M is Al, Ga, Y, or Sn), and Zn.

In the above, the atomic ratio of the element M to In in the first oxide is preferably greater than the atomic ratio of the element M to In in the second oxide.

In the above, preferably, the semiconductor device further includes a base, the semiconductor device includes a plurality of memory transistors over the base, and the plurality of memory transistors are stacked in a direction perpendicular to one surface included in the base.

In the above, the first insulator is preferably an oxide containing any one of silicon, aluminum, and hafnium.

In the above, the third insulator is preferably an oxide containing any one of silicon, aluminum, and hafnium.

In the above, the memory transistor may further include a fourth insulator and the fourth insulator is preferably provided in contact with an inner side of the third oxide.

Effect of the Invention

According to one embodiment of the present invention, a semiconductor device having favorable electrical characteristics in which the formation of trap centers is suppressed can be provided.

A semiconductor device having a large storage capacity per unit area can be provided. Alternatively, a semiconductor device having a novel structure in which memory cells (also referred to as memory transistors) are stacked can be provided. Alternatively, a semiconductor device having high productivity can be provided.

Alternatively, a module including the semiconductor device can be provided. Alternatively, an electronic device including the semiconductor device or the module can be provided. Alternatively, a novel semiconductor device can be provided. Alternatively, a novel module can be provided. Alternatively, a novel electronic appliance can be provided.

Note that the descriptions of the effects do not preclude the existence of other effects. One embodiment of the present invention does not necessarily achieve all the effects. Other effects will be apparent from and can be derived from the description of the specification, the drawings, the claims, and the like.

MODE FOR CARRYING OUT THE INVENTION

Figure 1A:
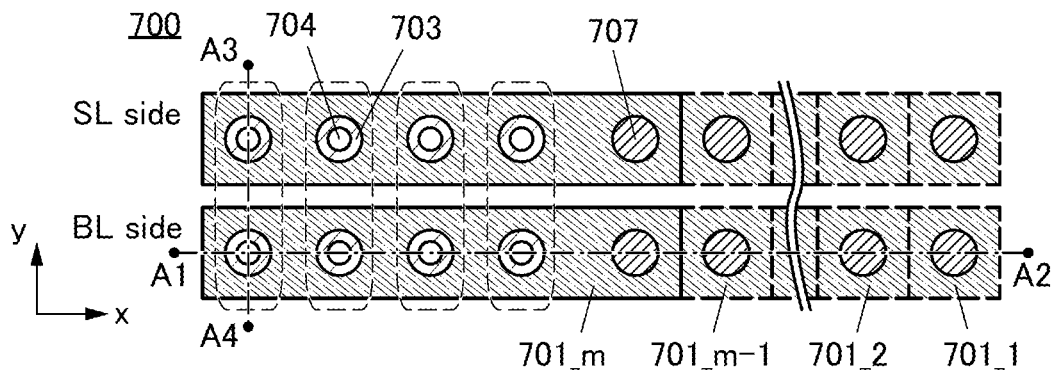
FIGS. 1A to 1D are top view and cross-sectional views illustrating a semiconductor device according to one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and embodiments of the present invention are not limited to shapes, values, or the like shown in the drawings.

Furthermore, in the drawings, the same portions or portions having similar functions are denoted by the same reference numerals in different drawings, and repeated description thereof is omitted. Furthermore, the same hatch pattern is used for the portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, terms for the description are not limited to those used in this specification, and description can be made appropriately depending on the situation.

Furthermore, in this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

Note that in this specification and the like, a nitride oxide refers to a compound in which the nitrogen content is higher than the oxygen content. Furthermore, an oxynitride refers to a compound in which the oxygen content is higher than the nitrogen content. Note that the content of each element can be measured by Rutherford backscattering spectrometry (RBS), for example.

In this specification and the like, the terms "film" and "layer" can be interchanged with each other. For example, the term "conductive layer" can be changed into the term "conductive film" in some cases. For another example, the term "insulating film" can be changed into the term "insulating layer" in some cases.

In this specification and the like, the term "parallel" indicates a state where two straight lines are placed such that the angle formed therebetween is greater than or equal to −10° and less than or equal to 10°. Accordingly, the case where the angle is greater than or equal to −5° and less than or equal to 5° is also included. The term "substantially parallel" indicates that the angle formed between two straight lines is greater than or equal to −30° and less than or equal to 30°. In addition, "perpendicular" indicates a state where the angle formed between two straight lines is greater than or equal to 80° and less than or equal to 100°. Accordingly, the case where the angle is greater than or equal to 85° and less than or equal to 95° is also included. The term "substantially perpendicular" indicates that the angle formed between two straight lines is greater than or equal to 60° and less than or equal to 120°.

Furthermore, in this specification, in the case where a crystal is a trigonal crystal or a rhombohedral crystal, the crystal is regarded as a hexagonal crystal system.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, when a metal oxide is used in an active layer of a transistor, the metal oxide is called an oxide semiconductor in some cases. That is, an OS FET can also be called a transistor including a metal oxide or an oxide semiconductor.

In this specification and the like, In:Ga:Zn=4:2:3 or a neighborhood thereof refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). In:Ga:Zn=5:1:6 or a neighborhood thereof refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). In:Ga:Zn=1:1:1 or a neighborhood thereof refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$).

Embodiment 1

In this embodiment, a structure, a manufacturing method, a circuit configuration, and an operation of a semiconductor device according to one embodiment of the disclosed invention are described with reference to FIG. 1A to FIG. 18C.

Memory Transistor and Memory Cell Array 700

Figure 1B:
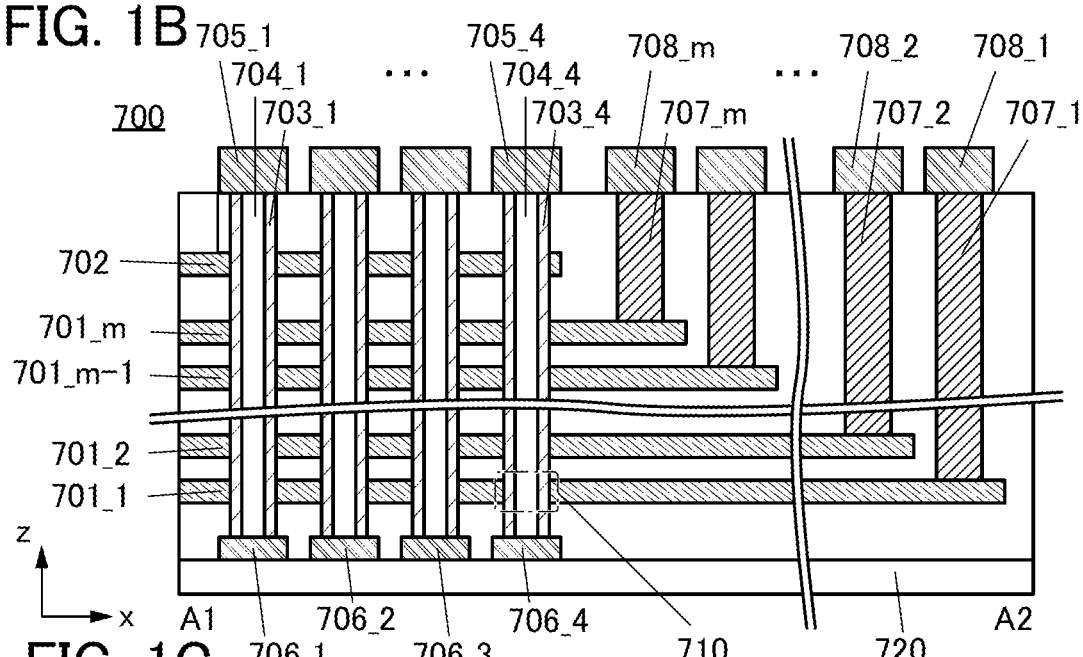
Figure 1C:
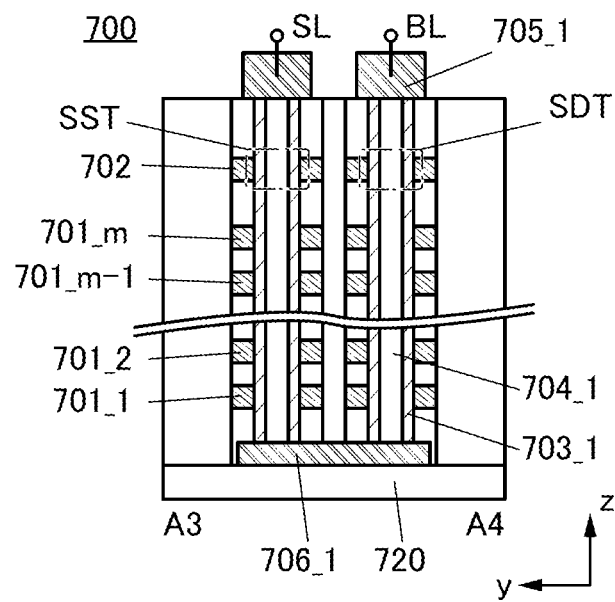
Figure 1D:
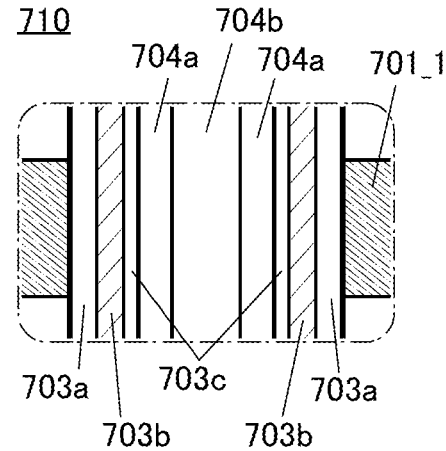
Figure 2A:
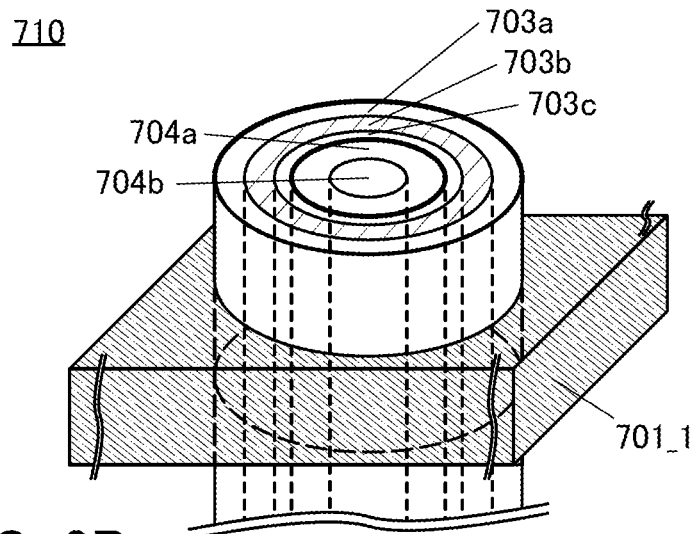
FIGS. 2A to 2C are perspective views illustrating a semiconductor device according to one embodiment of the present invention.
Figure 2B:
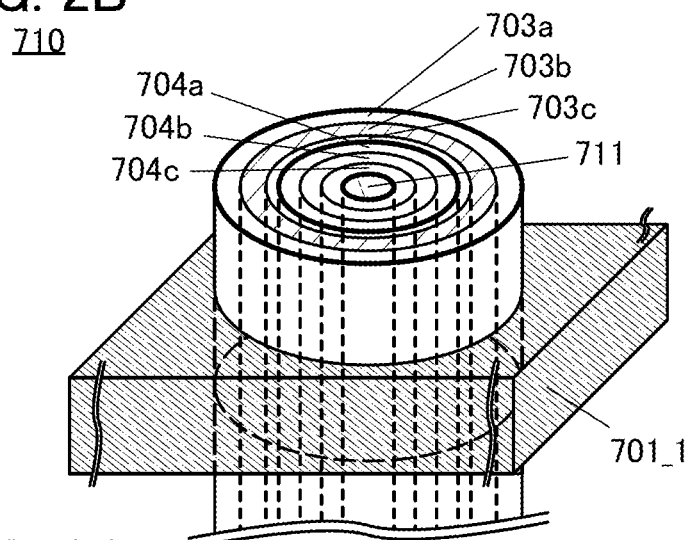
Figure 2C:
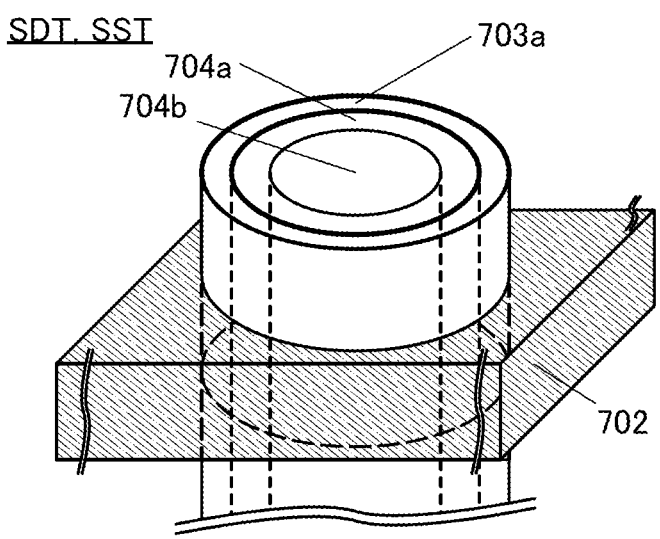

First, structures of a memory transistor and a memory cell array of the semiconductor device are described with reference to FIG. 1A to FIG. 3. FIG. 1A is a top view of a memory cell array 700 and FIG. 1B is a cross-sectional view of a portion indicated by a dashed-dotted line A1-A2 in FIG. 1A. FIG. 1C is a cross-sectional view of a portion indicated by a dashed-dotted line A3-A4 in FIG. 1A, which is a cross-sectional view illustrating a memory string. FIG. 1D, FIG. 2A, and FIG. 2B are enlarged views of a portion surrounded by a dashed-dotted line in FIG. 1B, which illustrate a memory transistor functioning as a memory cell. FIG. 1D illustrates a cross-sectional view of the memory transistor, and FIG. 2A and FIG. 2B_are perspective views of the memory transistor. FIG. 2C is an enlarged perspective view of a portion surrounded by dashed-dotted lines in FIG. 1C, which illustrates a transistor functioning as a selection transistor. Note that in the following description, rectangular coordinates using an x-axis, a y-axis, and a z-axis are set as illustrated in FIGS. 1A to 1C for the sake of convenience. Here, the x-axis and the y-axis are parallel to the top surface of a base 720 provided with the memory cell array 700 and the z-axis is perpendicular to the top surface of the base 720.

The memory cell array 700 includes: over the base 720, a stack in which a conductor 701 (a conductor 701_1 to a conductor 701_m (m is a natural number of 2 or more)) or a conductor 702 and an insulating film are alternately stacked; an insulator 703 (an insulator 703_1 to an insulator 703_4) inside an opening portion to penetrate the stack, an oxide 704 (an oxide 704_1 to an oxide 704_4) on the inner side of the insulator 703; a conductor 705 (a conductor 705_1 to a conductor 705_4) electrically connected to upper end portions of the oxide 704_1 to the oxide 704_4; a conductor 706 (a conductor 706_1 to a conductor 706_4) electrically connected to lower end portions of the oxide 704_1 to the oxide 704_4; a conductor 707 (a conductor 707_1 to a conductor 707_m) electrically connected to the conductor 701_1 to the conductor 701_m; and a conductor 708 (a conductor 708_1 to a conductor 708_m) electrically connected to the conductor 707_1 to the conductor 707_m. Note that in FIG. 1B, four or more stages of the conductors 701 are illustrated to show a plurality of conductors 701; however, this embodiment is not limited to FIG. 1B and at least two stages of the conductors 701 are provided.

As illustrated in FIG. 1A and FIG. 1B, the conductor 701 is provided to extend in the x-axis direction. As illustrated in FIG. 1B and FIG. 1C, the insulator 703 and the oxide 704 are provided to extend in the z-axis direction. That is, the conductor 701 is preferably provided to cross the insulator 703 and oxide 704 perpendicularly. Furthermore, as illustrated in FIG. 1B, the conductor 707 is provided to extend in the z-axis direction. The conductor 708 may be provided to extend in the y-axis direction. In addition, a conductor functioning as a wiring BL connected to the conductor 705 may be provided to extend in the y-axis direction. Part of the conductor 705 may function as the wiring BL and the conductor may be provided to extend in the y-axis direction.

The oxide 704 is formed in a columnar shape and provided to extend in the z-axis direction. The insulator 703 is provided to surround the periphery of the side of the columnar oxide 704. The conductor 707 is formed in a columnar shape and provided to extend in the z-axis direction.

The columnar oxide 704 is, in the z-axis direction, electrically connected to the conductor 706 at the lower end and electrically connected to the conductor 705 at the upper end. As illustrated in FIG. 1C, the conductor 706 is electrically connected to the lower ends of two adjacent columnar oxides 704, and the upper ends of the two columnar oxides 704 are electrically connected to the electrically separated conductors 705.

Here, a region where the conductor 701 crosses the insulator 703 and the oxide 704 and the vicinity of the region function as the memory transistor. A region where the conductor 702 crosses the insulator 703 and the oxide 704 and the vicinity of the region function as the selection transistor. The channel length directions of these memory transistor and selection transistor are parallel to the z-axis direction. The memory transistor and the selection transistor are electrically connected in series to form the memory string.

Note that the structure of the semiconductor device described in this embodiment is an example, and the present invention is not limited to the number, the position, and the like of the circuit element, the wiring, and the like illustrated in the drawings and the like according to this embodiment. The number, the position, and the like of the circuit element, the wiring, and the like included in the semiconductor device in this embodiment can be set as appropriate in accordance with the circuit configuration and the driving method.

The base 720 provided with the memory cell array 700 preferably has an insulating surface. As a substrate having an insulating surface, a semiconductor substrate provided with an insulating film on its surface, an insulator substrate, a conductor substrate provided with an insulator on its surface, or the like is used. For example, a semiconductor substrate of silicon, germanium, or the like, a semiconductor substrate of silicon carbide, silicon germanium, gallium arsenide, indium phosphide, zinc oxide, gallium oxide, or the like, or the like is used as the semiconductor substrate. For example, a glass substrate, a quartz substrate, a sapphire substrate, a stabilized zirconia substrate (such as an yttria-stabilized zirconia substrate), a resin substrate, or the like is used as the insulator substrate. A semiconductor substrate in which an insulator region is included in the above semiconductor substrate, for example, an SOI (Silicon On Insulator) substrate or the like may be used. A graphite substrate, a metal substrate, an alloy substrate, a conductive resin substrate, or the like is used as the conductor substrate.

The conductor 701 functions as the gate of the memory transistor and is electrically connected to a word line. That is, the conductor 701, the conductor 707, and the conductor 708 also function as part of the word line. Here, as illustrated in FIG. 1B, the conductor 701 is preferably provided in a step-like shape where the conductor 701 in the lower layer extends to be closer to the A2 side than the conductor 701 in the upper layer does. The conductor 701 is provided in this manner, so that the conductor 701 in the upper layer does not overlap with a region of part of the top surface of the conductor 701 in the lower layer; thus, the regions in the conductors 701 can be connected to the respective conductors 707.

For the conductor 701, a material having conductivity, such as silicon or metal, can be used. When silicon is used for the conductor 701, amorphous silicon or polysilicon can be used. A p-type impurity or an n-type impurity may be added to impart conductivity to silicon. As a conductive material containing silicon, silicide containing titanium, cobalt, or nickel can be used for the conductor 701. When a metal material is used for the conductor 701, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

The conductor 702 is provided above the conductor 701 with the insulating film therebetween. The conductor 702 functions as the gate of the selection transistor (the selection transistor on the bit line side: SDT and the selection transistor on the source line side: SST). For the conductor 702, a material similar to that for the conductor 701 can be used. For the conductor 702, the same material as the conductor 701 may be used or a material different from that for the conductor 701 may be used. The materials used for the conductor 701 and the conductor 702 are determined depending on the usage of the conductor 701 and the conductor 702 in consideration of work function or the like.

As insulating film provided in the upper layer and the lower layer of the conductor 701 and the conductor 702, an oxide, a nitride, an oxynitride, a nitride oxide, a metal oxide, a metal oxynitride, a metal nitride oxide, or the like which has an insulating property can be used. Silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin has a low relative permittivity and thus is preferably used for the insulating film.

Although aluminum oxide, gallium oxide, hafnium oxide, zirconium oxide, an oxide including aluminum and hafnium, an oxynitride including aluminum and hafnium, an oxide including silicon and hafnium, an oxynitride including silicon and hafnium, a nitride including silicon and hafnium, or the like can be used for the insulating film, these materials have a high relative permittivity; thus, parasitic capacitance may be generated between the conductors 701 or between the conductor 701 and the conductor 702. The material used for the insulating film can be determined depending on the design or the usage of the device.

As shown in FIG. 1D, the insulator 703 includes an insulator 703a, an insulator 703b, and an insulator 703c. The insulator 703a is provided on the conductor 701 side, the insulator 703c is provided on the oxide 704 side, and the insulator 703b is provided between the insulator 703a and the insulator 703c. The insulator 703a functions as a gate insulating layer, the insulator 703b functions as a charge accumulation layer, and the insulator 703c functions as a tunnel insulating layer.

The charge accumulation layer or the tunnel insulating layer is not necessarily provided in the selection transistor as illustrated in FIG. 2C. Thus, the transistor on the bit line side: SDT and the transistor on the source line side: SST may have a structure in which the insulator 703b and the insulator 703c are not provided and only the insulator 703a is provided as the insulator 703. In FIG. 2C, the oxide 704 has a two-layer structure of the oxide 704a and the oxide 704b; however, the present invention is not limited thereto. As illustrated in FIG. 2B, the oxide 704 may have a three-layer structure of the oxide 704a, the oxide 704b, and the oxide 704c or a stacked-layer structure of four or more layers. In addition, an insulator 711 may be provided on the inner side of the oxide 704b.

For the insulator 703a, silicon oxide or silicon oxynitride is preferably used. Aluminum oxide, hafnium oxide, or an oxide including aluminum and hafnium may be used. These materials may be stacked to be the insulator 703a.

For the insulator 703b, a material functioning as a charge accumulation layer is preferably used, and silicon nitride or silicon nitride oxide is preferably used. Aluminum oxide, hafnium oxide, or an oxide including aluminum and hafnium may be used.

For the insulator 703c, silicon oxide or silicon oxynitride is preferably used. Aluminum oxide, hafnium oxide, or an oxide including aluminum and hafnium may be used. These materials may be stacked to be the insulator 703c. The insulator 703c is preferably thinner than the insulator 703a. Although details are described later, in writing or erasing data to/from the memory transistor, charge is transferred between the oxide 704 and the insulator 702b through the insulator 703c. That is, the insulator 703c functions as a tunnel insulating layer.

In particular, in the case where the insulator 703 is formed in the opening provided in the stack including the conductor 701, the conductor 702, and the insulating films, the insulator 703 formed on the bottom portion of the opening needs to be removed by anisotropic etching using dry etching or the like. In anisotropic etching, the side surface of the insulator 703c is also exposed to plasma, a radical, a gas, a chemical solution, or the like. When they damage the side surface of the insulator 703c, trap centers might be generated in the insulator 703c and might affect electrical characteristics of the transistor. In order that the generation of the trap centers be inhibited, the side surface of the insulator 703c is required to be highly resistant to damage from etching. In this case, for the insulator 703c, aluminum oxide, a stack of silicon oxide and aluminum oxide, or a stack of silicon oxynitride and aluminum oxide is preferably used.

The insulator 703a, the insulator 703b, and the insulator 703c can be formed by an ALD method or a CVD method. In order that the interfaces between the insulator 703a, the insulator 703b, and the insulator 703c be prevented from being contaminated, these insulators are preferably deposited in succession without exposure to an air atmosphere in the same chamber or with a multi-chamber deposition apparatus including a plurality of chambers.

For the oxide 704, a metal oxide functioning as an oxide semiconductor (hereinafter also referred to as an oxide semiconductor) is preferably used. An oxide semiconductor is preferred because it enables have a transistor to have favorable on-state characteristics and high mobility as compared with a semiconductor made of silicon, for example.

For example, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) can be used as the oxide 704. An In—Ga oxide or an In—Zn oxide may be used as the oxide 704.

The oxide 704 preferably includes the oxide 704a provided on the insulator 703c side and the oxide 704b provided on the inner side of the oxide 704a. At this time, as the oxide 704a, an oxide having an energy gap relatively wider than that of the oxide 704b is preferably used. Here, in some cases, an oxide having a wide energy gap is referred to as a wide gap, and an oxide having a narrow energy gap is referred to as a narrow gap.

In the case where the oxide 704a is a wide gap and the oxide 704b is a narrow gap, an energy of the conduction band minimum of the oxide 704a is preferably higher than an energy of the conduction band minimum of the oxide 704b. In other words, the electron affinity of the oxide 704a is preferably smaller than the electron affinity of the oxide 704b.

The oxide 704a and the oxide 704b are preferably combined to have different atomic ratios of metal atoms. Specifically, the atomic ratio of the element M to constituent elements in the metal oxide used as the oxide 704a is preferably greater than the atomic ratio of the element M to constituent elements in the metal oxide used as the oxide 704b. The atomic ratio of the element M to In in the metal oxide used as the oxide 704a is preferably greater than the atomic ratio of the element M to In in the metal oxide used as the oxide 704b. The atomic ratio of In to the element M in the metal oxide used as the oxide 704b is preferably greater than the atomic ratio of In to the element M in the metal oxide used as the oxide 704a.

As the oxide 704a, for example, a metal oxide having a composition of In:Ga:Zn=1:3:4, In:Ga:Zn=1:3:2, or In:Ga:Zn=1:1:1, or a composition which is in the neighborhood thereof can be used. As the oxide 704b, for example, a metal oxide having a composition of In:Ga:Zn=4:2:3 to 4:2:4.1, In:Ga:Zn=1:1:1, or In:Ga:Zn=5:1:6, or a composition which is in the neighborhood thereof can be used. These oxide 704a and oxide 704b are preferably combined to satisfy the above relation of the atomic ratios. For example, it is preferable that the oxide 704a be a metal oxide having a composition of In:Ga:Zn=1:3:4 or a composition which is in the neighborhood thereof and the oxide 704b be a metal oxide having a composition of In:Ga:Zn=4:2:3 to 4:2:4.1 or a composition which is in the neighborhood thereof. Note that the above composition represents the atomic ratio of an oxide formed over a base or the atomic ratio of a sputtering target.

It is also preferable that a CAAC-OS described later be used as the oxide 704a and a CAC-OS be used as the oxide 704b. In the case where the CAAC-OS is used as the oxide 704a, the c-axes are preferably aligned parallel to the x-y plane shown in FIG. 1A and the like, that is, perpendicular to the z-axis, and preferably aligned from the side surface of the opening to the central portion.

Here, in a junction portion of the oxide 704a and the oxide 704b, the conduction band minimum is gradually changed. In other words, the conduction band minimum at the junction portion of the oxide 704a and the oxide 704b is continuously varied or continuously connected. For this, the density of defect states in a mixed layer formed at the interface between the oxide 704a and the oxide 704b can be decreased.

Specifically, when the oxide 704a and the oxide 704b contain the same element (as a main component) in addition to oxygen, a mixed layer with a low density of defect states can be formed. For example, in the case where the oxide 704b is an In—Ga—Zn oxide, it is preferable to use an In—Ga—Zn oxide, a Ga—Zn oxide, gallium oxide, or the like for the oxide 704a. Accordingly, the density of defect states at the interface between the oxide 704a and the oxide 704b can be decreased. Thus, the influence of interface scattering on carrier conduction is small, and the memory transistor 710 can have a high on-state current.

Note that the details of the metal oxide that can be used as the oxide 704 are described later.

FIG. 1D is an enlarged view of the memory transistor 710 surrounded by a dashed-dotted line in FIG. 1B. FIG. 2A is a perspective view of the memory transistor 710. As illustrated in FIG. 1D and FIG. 2A, the oxide 704b is provided to be surrounded by the oxide 704a. In the case of such a structure, carriers mainly flow in the component having a narrow gap when the carriers flow in the oxide 704 from the conductor 705 toward the conductor 706 or from the conductor 706 toward the conductor 705. Therefore, in the case where the above structure is used, high current drive capability in the on state of the transistor, that is, high on-state current and high field-effect mobility, can be obtained.

The oxide 704a is provided between the oxide 704b and the insulator 703c, whereby the oxide 704b serving as a carrier path and the insulator 703c are not in direct contact with each other, so that the formation of trap centers can be inhibited. The trap centers formed at the interface between the semiconductor (oxide semiconductor) and the insulator trap electrons and cause the threshold voltage of the transistor to shift in the positive direction, which might adversely affect the reliability and the on-off characteristics of the transistor. Thus, electrical characteristics of a transistor using the oxide are not affected by the trap centers, so that higher current drive capability in the on state, i.e., higher on-state current and higher field-effect mobility can be obtained. Furthermore, the transistor and a semiconductor device using the transistor can have high reliability.

Note that although the oxide 704 illustrated in FIG. 1D and FIG. 2A is provided such that the oxide 704a surrounds the oxide 704b, this embodiment is not limited thereto. FIG. 2B illustrates a different example of the memory transistor 710. In FIG. 2B, in the memory transistor 710, the oxide 704a is provided on the inner side of the insulator 703a, the insulator 703b, and the insulator 703c, the oxide 704b is provided on the inner side of the oxide 704a, and the oxide 704c is provided on the inner side of the oxide 704b. The insulator 711 may be provided to be embedded on the inner side of the oxide 704c. Note that the insulator 711 is not necessarily provided, and the inner side of the oxide 704c may be a void.

The oxide 704b may be provided to be sandwiched between the oxide 704a and the oxide 704c. At this time, the oxide 704c is preferably a wide gap like the oxide 704a.

When the oxide 704c which is a wide gap is provided, carriers flowing through the oxide 704 can be confined in the oxide 704b, so that high current drive capability in the on state of the transistor, i.e., high on-state current and high field-effect mobility can be obtained.

In the case where the insulator 711 is provided on the inner side of the oxide 704c, the insulator 711 is preferably a material that can supply oxygen to the oxide 704 or a material that can supply impurities, such as hydrogen and nitrogen. When an oxide that contains hydrogen and nitrogen as little as possible is used for the insulator 711, oxygen can be supplied to the oxide 704 in some cases. By supplying oxygen to the oxide 704, impurities such as hydrogen and water contained in the oxide 704 can be removed and the oxide 704 is highly purified. When an oxide in which impurities are reduced as much as possible is used as the oxide 704, the memory transistor and the semiconductor device using the transistor can have high reliability.

When an oxide containing hydrogen and nitrogen is used for the insulator 711, hydrogen and nitrogen can be supplied to the oxide 704 in some cases. When hydrogen and nitrogen are supplied to the oxide 704, the resistance value of the oxide 704 is decreased in some cases. The resistance value of the oxide 704 is decreased to the extent that it does not hinder the circuit operation, whereby the memory transistor can operate with lower driving voltage. Furthermore, high current drive capability in the on state of the memory transistor, i.e., high on-state current and high field-effect mobility can be obtained.

The top view of the opening formed in the stack provided with the memory transistor 710 is, but not limited to, circular as illustrated in FIG. 1A, FIGS. 2A and 2B, and the like; the top view may be, for example, elliptic or polygonal, e.g., a triangle or a quadrangle. In the case of a polygonal shape, corner portions in the shape may be rounded. The top-view shapes of the insulator 703 and the oxide 704 may change depending on the top-view shape of the opening. The opening may have a shape where a lower cross sectional area of the opening (on the conductor 706 side) is narrower than an upper cross sectional area of the opening (on the conductor 705 side).

The memory transistor is formed of the oxide 704, the insulator 703, and the conductor 701 (any one of the conductor 701_1 to the conductor 701_$m$). FIG. 1B shows an example in which m stages of memory transistors (m is a natural number of 4 or more) are stacked.

The conductor 705 is electrically connected to the oxide 704 and functions as part of the source line SL or part of the bit line BL. As the conductor 705, a conductive material containing a metal element is preferably used. A metal compound layer containing the metal element included in the conductor 705 and the component of the oxide 704 is preferably formed at the interface between the conductor 705 and the oxide 704. The metal compound is preferably formed, in which case the contact resistance between the conductor 705 and the oxide 704 is reduced. Alternatively, oxygen contained in the oxide 704 is absorbed by the conductor 705 and the resistance of the oxide 704 in the vicinity of the interface between the conductor 705 and the oxide 704 is reduced, whereby the contact resistance between the conductor 705 and the oxide 704 can be reduced.

A conductive material containing one or more metal elements selected from aluminum, ruthenium, titanium, tantalum, chromium, tungsten, and copper is preferably used as the conductor 705.

As illustrated in FIG. 1C, the conductor 706 electrically connects the oxide 704 electrically connected to the conductor 705 which functions as part of the bit line BL to the oxide 704 electrically connected to the conductor 705 functions as part of the source line SL, so that the memory string is formed. Regions surrounded by dotted lines in FIG. 1A represents memory strings. In other words, FIG. 1A illustrates a memory cell array 700 including four memory strings.

For the conductor 706, a material similar to that for the conductor 705 can be used. For the conductor 706, the same material as the conductor 705 may be used or a material different from that for the conductor 705 may be used.

A metal compound layer containing the metal element included in the conductor 706 and the component of the oxide 704 is preferably formed at the interface between the conductor 706 and the oxide 704. The metal compound is preferably formed, in which case the contact resistance between the conductor 706 and the oxide 704 is reduced. Alternatively, oxygen contained in the oxide 704 is absorbed by the conductor 706 and the resistance of the oxide 704 in the vicinity of the interface between the conductor 706 and the oxide 704 is reduced, whereby the contact resistance between the conductor 706 and the oxide 704 can be reduced.

(Memory Cell Array 700A)

Figure 3:
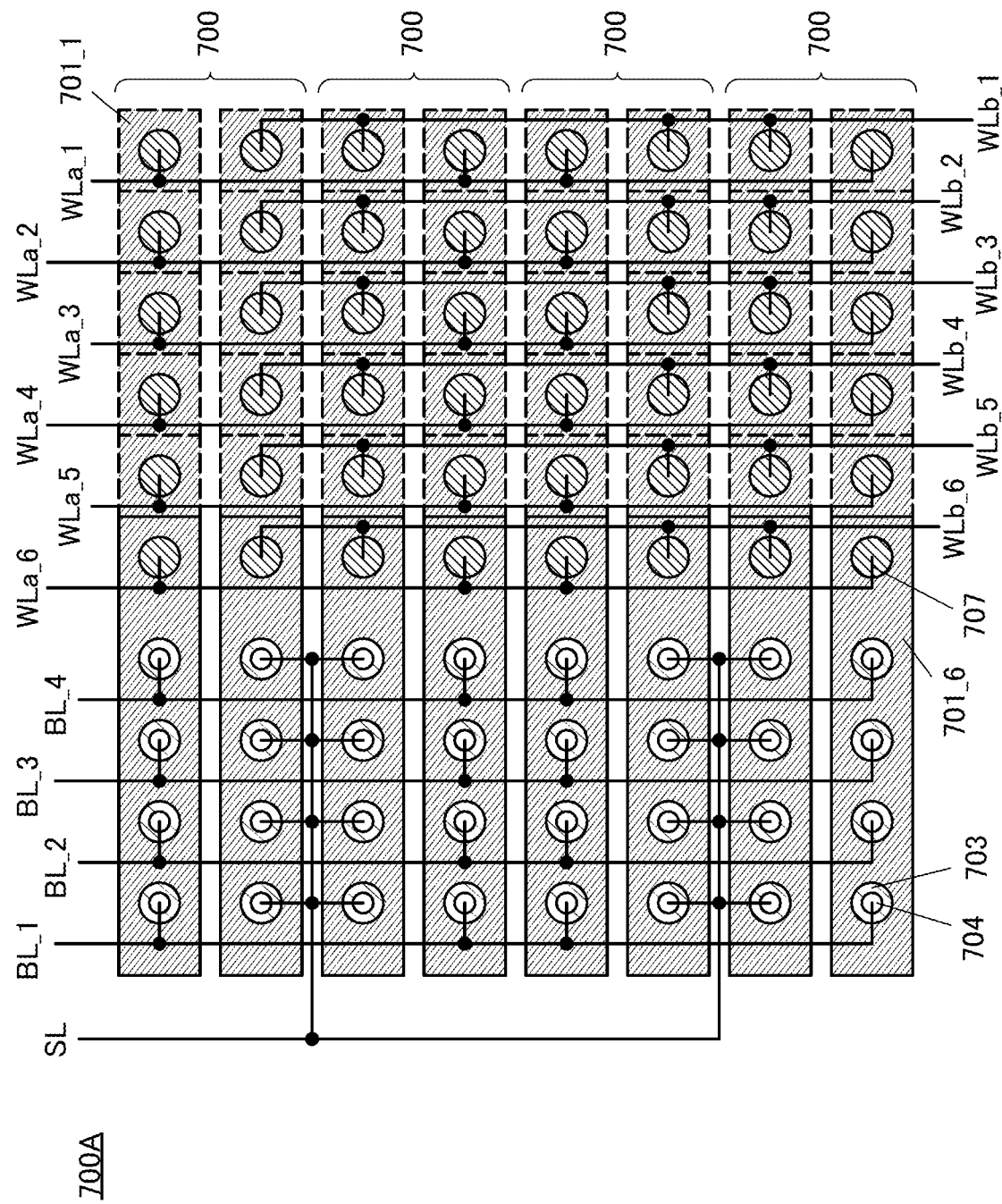
FIG. 3 is a top view illustrating a semiconductor device according to one embodiment of the present invention.

FIG. 3 is a top view illustrating a memory cell array 700A in which a plurality of memory cell arrays 700 including six stages of memory transistors are combined. Note that in FIG. 3, some components are omitted for simple description. For example, the selection transistors (the transistor on the bit line side: SDT and the transistor on the source line side: SST) provided over the conductor 701 and the conductor 702 which is the component thereof are omitted. The conductors 705 functioning as part of the bit line BL and part of the source line SL and the conductor 708 functioning as part of the word line WL are shown by solid lines.

In the memory cell array 700A, each memory cell array 700 includes four memory strings including six stages of memory transistors.

The ends of the memory strings on the bit line side are electrically connected to the respective bit lines BL (BL_1 to BL_4). The ends of the memory strings on the source line side are electrically connected to the source line SL and are supplied with a common potential. The source line SL may be grounded or may be supplied with a constant potential. Alternatively, the potential may be changed depending on the circuit operation.

The conductor 701_1 to the conductor 701_6 are electrically connected to the respective word lines WL. The conductor 701_1 to the conductor 701_6 on the bit line side are electrically connected to WLa_1 to WLa_6, respectively, and the conductor 701_1 to the conductor 701_6 on the source line side are electrically connected to WLb_1 to WLb_6, respectively.

By selecting the bit line BL (BL_1 to BL_4) and the word line (WLa_1 to WLa_6 and WLb_1 to WLb_6) as appropriate, a given memory transistor in the memory cell array 700 can be selected. In addition, writing, reading, erasing, and the like can be performed on the selected memory transistor.

Since the selection transistor (not illustrated) is provided in each memory string, the given memory cell array 700 in the memory cell array 700A can be selected, and writing, readout, erasing, and the like can be performed on the given memory transistor in the selected memory cell array 700.

Metal Oxide

A metal oxide that can be used for the oxide 704 according to the present invention will be described below.

The metal oxide preferably contains at least indium or zinc. In particular, indium and zinc are preferably contained. Aluminum, gallium, yttrium, tin, or the like is preferably contained in addition to them. One kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is In-M-Zn oxide, which contains indium, an element M, and zinc, is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements is combined as the element M in some cases.

Note that in this specification and the like, a metal oxide containing nitrogen is also collectively referred to as a metal oxide in some cases. A metal oxide containing nitrogen may be referred to as a metal oxynitride.

Composition of Metal Oxide

The composition of a CAC (Cloud-Aligned Composite)-OS which can be used for a transistor disclosed in one embodiment of the present invention will be described below.

In this specification and the like, CAAC (c-axis aligned crystal) and CAC (Cloud-Aligned Composite) are stated in some cases. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons serving as carriers (or holes) to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide is formed of components having different energy gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

<Structure of Metal Oxide>

Oxide semiconductors (metal oxides) can be classified into a single crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), an amorphous oxide semiconductor, and the like.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as a grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

Transistor Including Metal Oxide

Next, the case where the metal oxide is used for a channel formation region of a transistor will be described.

When the metal oxide is used for a channel formation region of a transistor, the transistor can have high field-effect mobility. In addition, the transistor having high reliability can be achieved.

Here, an example of the hypothesis about electric conduction of a metal oxide will be described.

Electric conduction in a solid is prevented by a scattering source which is called a scattering center. For example, it is known that in single crystal silicon, lattice scattering and ionized impurity scattering are main scattering centers. In other words, in the intrinsic state with few lattice defects and impurities, the carrier mobility is high because there is no constraint in the electric conduction in a solid.

It is supposed that the above is applied to a metal oxide. For example, there are probably many oxygen vacancies Vo in a metal oxide containing oxygen less than that satisfies the stoichiometric composition. The atoms existing around these oxygen vacancies are located in a distorted place more than in the intrinsic state. The distortion due to the oxygen vacancies might become a scattering center.

For example, there is excess oxygen in a metal compound containing more oxygen than that satisfies the stoichiometric composition. Excess oxygen in a liberated state in the metal compound becomes $O^-$ or $O^{2-}$ by receiving an electron. Excess oxygen that has become $O^-$ or $O^{2-}$ might be a scattering center.

As described above, in the case where the metal oxide has an intrinsic state containing oxygen that satisfies the stoichiometric composition, the carrier mobility is probably high.

Since in an indium-gallium-zinc oxide (hereinafter IGZO), which is one kind of metal oxide containing indium, gallium, and zinc, crystal growth tends to hardly occur particularly in the air, a small crystal (e.g., the above-described nanocrystal) is structurally stabilized compared with a large crystal (here, a crystal whose size is several millimeters or several centimeters) in some cases. This is probably because in the case where small crystals are connected to each other, distortion energy is relieved as compared with the case of forming a large crystal.

In a region where small crystals are connected to each other, defects may be formed to relieve the distortion energy of the region. Thus, the distortion energy is relieved without formation of a defect in the region, whereby the carrier mobility can be increased.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charge trapped by the trap states in the metal oxide takes a long time to be released and behaves like fixed charge in some cases. Thus, a transistor having a metal oxide with high density of trap states in a channel formation region has unstable electrical characteristics in some cases.

Thus, it is effective to reduce the concentration of impurities in the metal oxide to make the electrical characteristics of the transistor stable. In addition, in order to reduce the concentration of impurities in the metal oxide, the concentration of impurities in an adjacent film is also preferably reduced. As an impurity, hydrogen, nitrogen, an alkali metal, an alkaline earth metal, iron, nickel, silicon, and the like can be given.

Impurities

Here, the influence of each impurity in the metal oxide will be described.

When silicon or carbon that is one of the Group 14 elements is contained in the metal oxide, defect states are formed in the metal oxide. Thus, the concentration of silicon or carbon in the metal oxide and the concentration of silicon or carbon around an interface with the metal oxide (the concentration measured by secondary ion mass spectrometry (SIMS)) is set to be lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using, in a channel formation region, a metal oxide containing an alkali metal or alkaline earth metal is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide measured by SIMS is set to be lower than or equal to $1\times10^{18}$ atoms/cm$^3$, preferably lower than or equal to $2\times10^{16}$ atoms/cm$^3$.

Furthermore, when the metal oxide contains nitrogen, the metal oxide easily becomes n-type because of generation of electrons serving as carriers and an increase in carrier density. As a result, a transistor in which a metal oxide containing nitrogen is used in a channel formation region is likely to have normally-on characteristics. Thus, nitrogen in the channel formation region in the metal oxide is preferably reduced as much as possible. For example, the concentration of nitrogen in the metal oxide, which is measured by SIMS, is set to be lower than $5\times10^{19}$ atoms/cm$^3$, preferably lower than or equal to $5\times10^{18}$ atoms/cm$^3$, further preferably lower than or equal to $1\times10^{18}$ atom/cm$^3$, still further preferably lower than or equal to $5\times10^{17}$ atoms/cm$^3$.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, part of hydrogen is bonded to oxygen, which is bonded to a metal atom, whereby an electron serving as a carrier is generated. Thus, a transistor including the metal oxide that includes hydrogen is likely to be normally on. Therefore, hydrogen in the metal oxide is preferably reduced as much as possible. Specifically, the hydrogen concentration of the metal oxide, which is measured by SIMS, is set to be lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide whose impurities are sufficiently reduced is used for a channel formation region in a transistor, the off-state current of the transistor can be reduced, and stable electrical characteristics can be provided.

Method of Manufacturing Memory Cell Array

Next, one embodiment of a method of manufacturing a memory cell array of the present invention is described with reference to FIG. 4A to FIG. 13D. In each figure of FIG. 4A to FIG. 13C, FIG. xxA is a top view seen from the z axis direction, and FIG. xxB is a cross-sectional view of a portion indicated by the dashed-dotted line A1-A2 in FIG. xxA. Furthermore, FIG. xxC is a cross-sectional view of a portion indicated by the dashed-dotted line A3-A4 in FIG. xxA. FIG. 12D and FIG. 13D are enlarged cross-sectional views of portions surrounded by dashed-dotted lines in FIG. 12B and FIG. 13B, respectively.

Figure 4A:
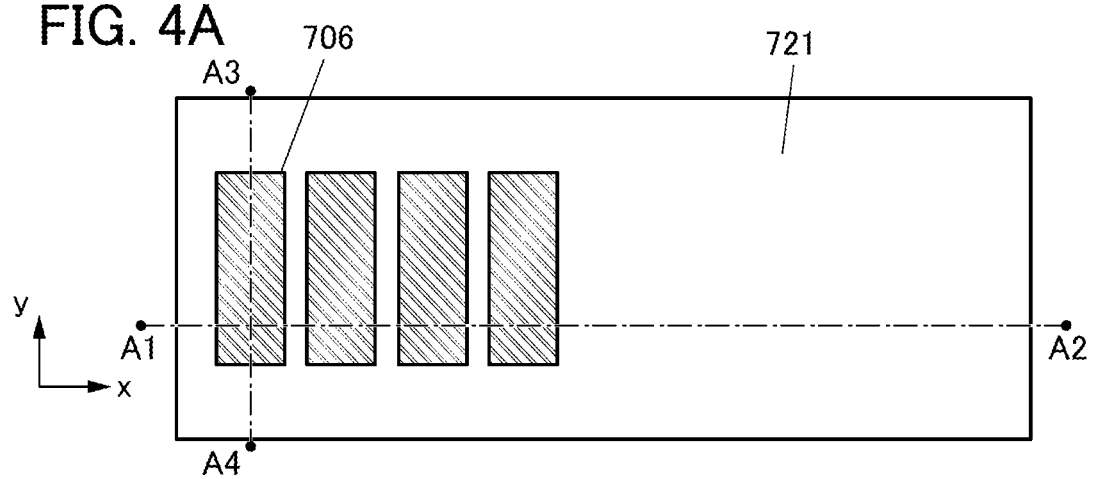
FIGS. 4A to 4C are top view and cross-sectional views illustrating a process of fabricating a semiconductor device according to one embodiment of the present invention.
Figure 4B:
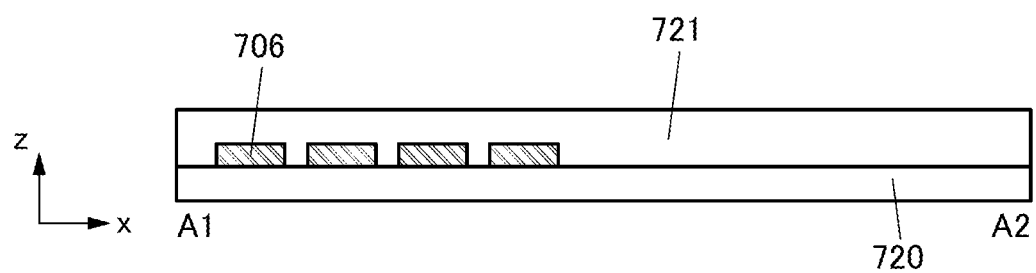
Figure 4C:
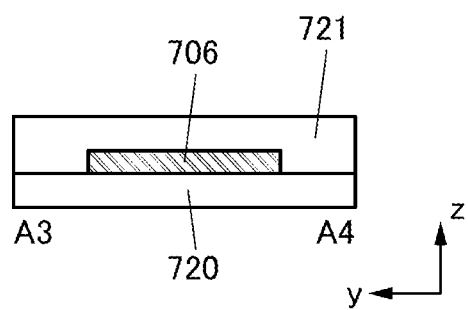
Figure 5A:
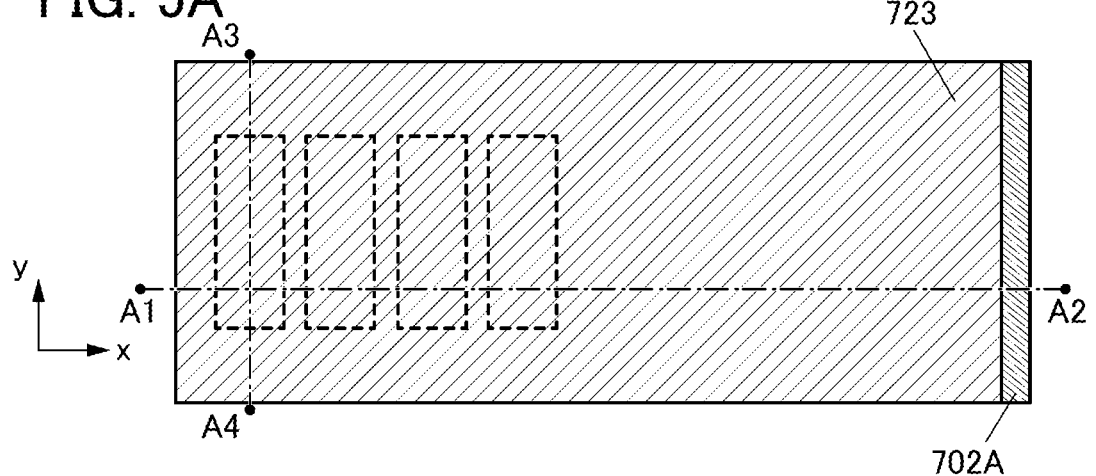
FIGS. 5A to 5C are top view and cross-sectional views illustrating a process of fabricating a semiconductor device according to one embodiment of the present invention.
Figure 5B:
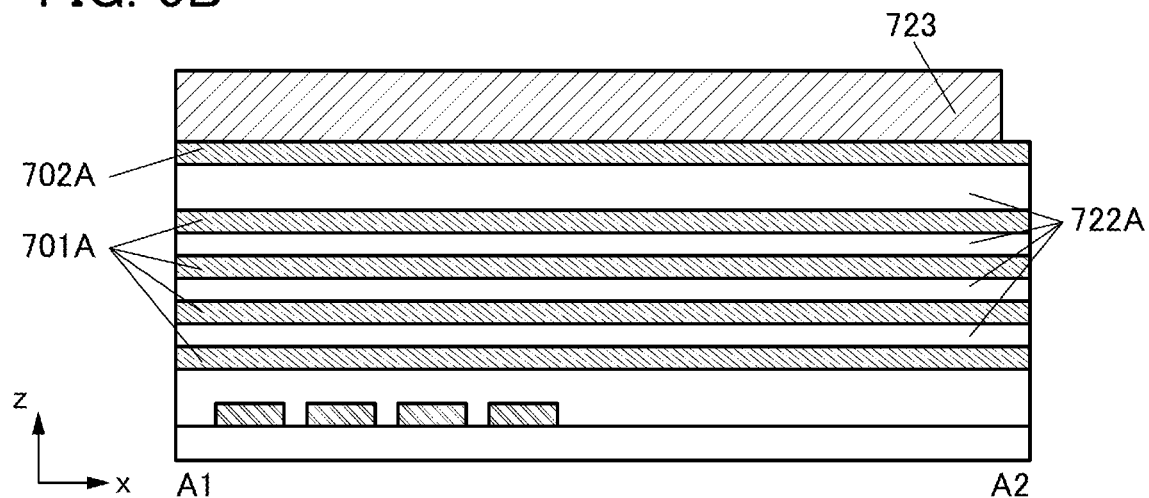
Figure 5C:
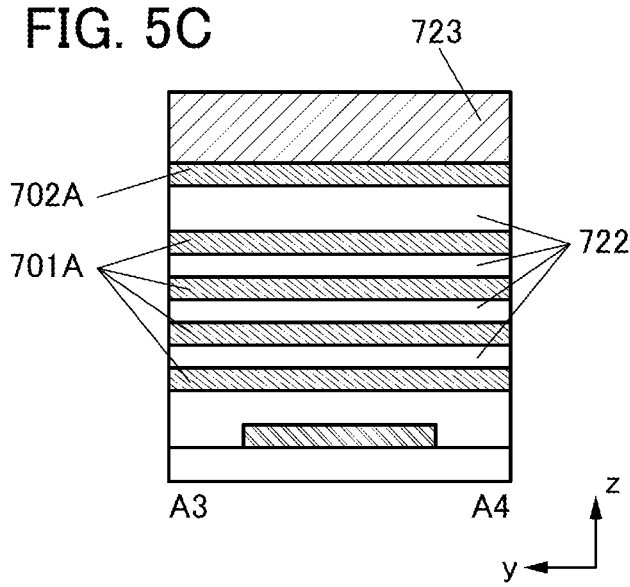

First, the conductor 706 is formed over the base 720 having an insulating surface, and an insulating film 721 is formed to cover the conductor 706 (see FIGS. 4A to 4C).

For the conductor 706, a conductive film to be the conductor 706 is first formed and processed by a lithography method; thus, the conductor 706 can be formed. Note that the method of forming the conductor 706 and the insulating film 721 is not limited thereto. The insulating film 721 may be formed over the base 720 and an unnecessary portion of the insulating film 721 may be removed to form a groove or an opening, and the conductor 706 may be embedded in the groove or the opening portion. Such a method of forming a conductor is referred to as a damascene method (a single damascene method or a dual damascene method) in some cases. When an insulating film is further formed over the conductor 706 formed by the damascene method and the insulating film 721, the structure illustrated in FIGA. 4A to 4C can be obtained.

The conductor 706 and the insulating film 721 can be formed by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method, according to a source gas.

By a plasma CVD method, a high-quality film can be obtained at a relatively low temperature. Furthermore, a thermal CVD method does not use plasma and thus causes less plasma damage to an object. For example, a wiring, an electrode, an element (such as a transistor or a capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method is also a deposition method which enables less plasma damage to an object. An ALD method does not cause plasma damage during deposition, so that a film with few defects can be obtained.

Unlike a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. Note that an ALD method has a relatively low deposition rate; thus, it is sometimes preferable to combine an ALD method with another deposition method with a high deposition rate such as a CVD method.

When a CVD method or an ALD method is used, composition of a film to be obtained can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, productivity of semiconductor devices can be improved in some cases.

Note that in the lithography method, first, a resist is exposed to light through a photomask. Next, a region exposed to light is removed or left using a developing solution, so that a resist mask is formed. Then, etching treatment through the resist mask is performed, so that the conductor, the semiconductor, the insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing or wet etching treatment can be used for removal of the resist mask. Alternatively, the resist mask can be removed by performing wet etching treatment after dry etching treatment or by performing dry etching treatment after wet etching treatment.

A hard mask formed of an insulator or a conductor may be used instead of the resist mask. In the case where a hard mask is used, a hard mask with a desired shape can be formed by forming an insulating film or a conductive film to be the hard mask material over the conductive film, forming a resist mask thereover, and then etching the hard mask material.

For the processing, a dry etching method or a wet etching method can be employed. Processing by a dry etching method is suitable for microfabrication.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may employed different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

In the case where a hard mask is used for etching of the conductive film, the etching treatment may be performed after the resist mask used for formation of the hard mask is removed or with the resist mask left. In the latter case, the resist mask may be removed during the etching. The hard mask may be removed by etching after the etching of the conductive film. The hard mask does not need to be removed in the case where the material of the hard mask does not affect the following process or can be utilized in the following process.

As the conductive film to be the conductor 706, a conductive film containing a metal element is preferably formed by a sputtering method. The conductive film can also be formed by a CVD method.

The surface of the insulating film 721 is preferably subjected to planarization treatment as needed. A chemical mechanical polishing (CMP) method or a reflow method can be used as the planarization treatment.

Next, conductive films 701A and insulating films 722A are alternately stacked over the conductor 706 and the insulating film 721. This embodiment shows an example in which the conductive film 701A is formed over the insulating film 721 and the insulating film 722A is formed over the conductive film 701A; however, the order of the formation is not limited thereto. The insulating film 722A may be formed over the insulating film 721, and the conductive film 701A may be formed over the insulating film 722A. A CVD method can be used for the formation of the conductive film 701A and the insulating film 722A. A sputtering method may be used.

Although the conductive films 701A and the insulating films 722A are each formed to have four layers in this embodiment, the number of stacked layers is not limited thereto. Each may be formed to have five or more layers depending on the required performance of the semiconductor device. For example, the conductive films 701A and the insulating films 722A may each be formed to have 32 layers, 64 layers, 128 layers, or 200 or more layers.

A conductive film 702A is formed over the uppermost layer of the insulating film 722A. A mask 723 is formed over the conductive film 702A (see FIGS. 5A to 5C). The conductive film 702A can be formed using a method and a material similar to those of the conductive film 701A. The conductive film 702A may be formed by the same method as or a method different from that of the conductive film 701A. The conductive film 702A may be formed using the same material as or a material different from that of the conductive film 701A.

Figure 6A:
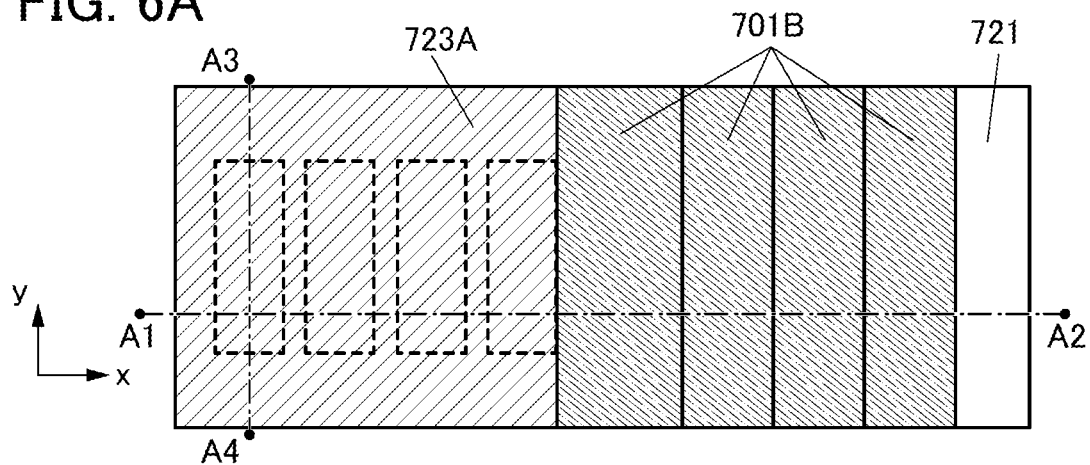
FIGS. 6A to 6C are top view and cross-sectional views illustrating a process of fabricating a semiconductor device according to one embodiment of the present invention.
Figure 6B:
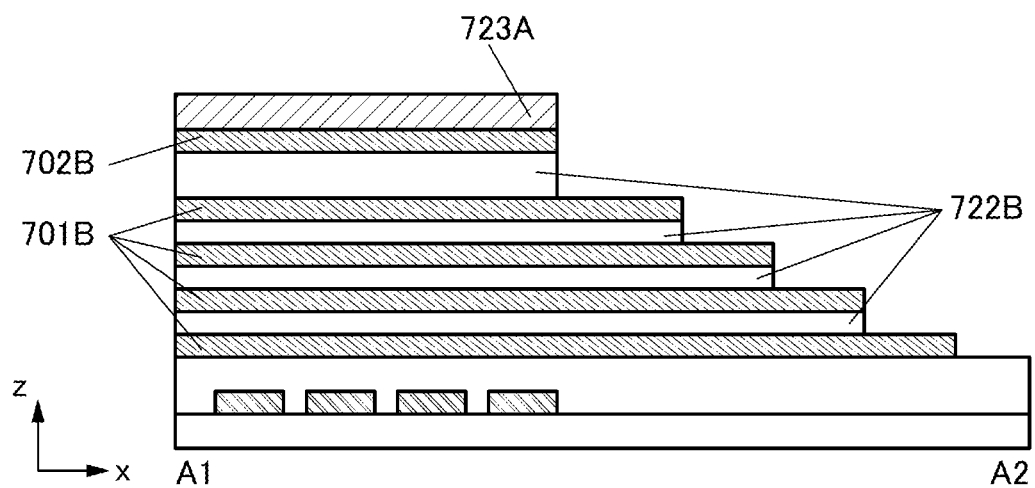
Figure 6C:
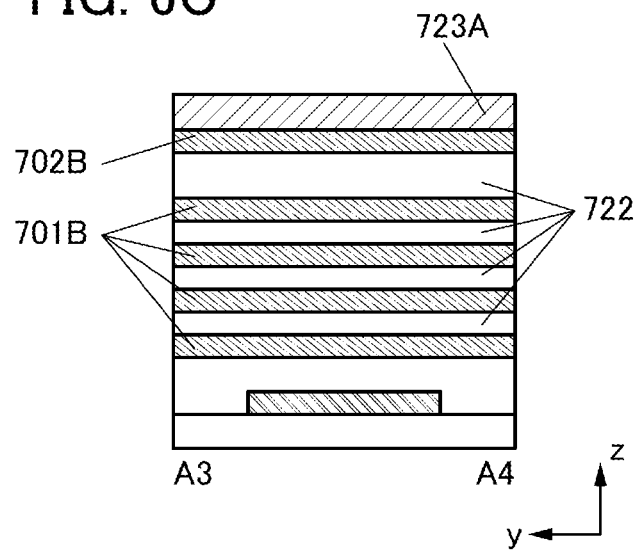
Figure 7A:
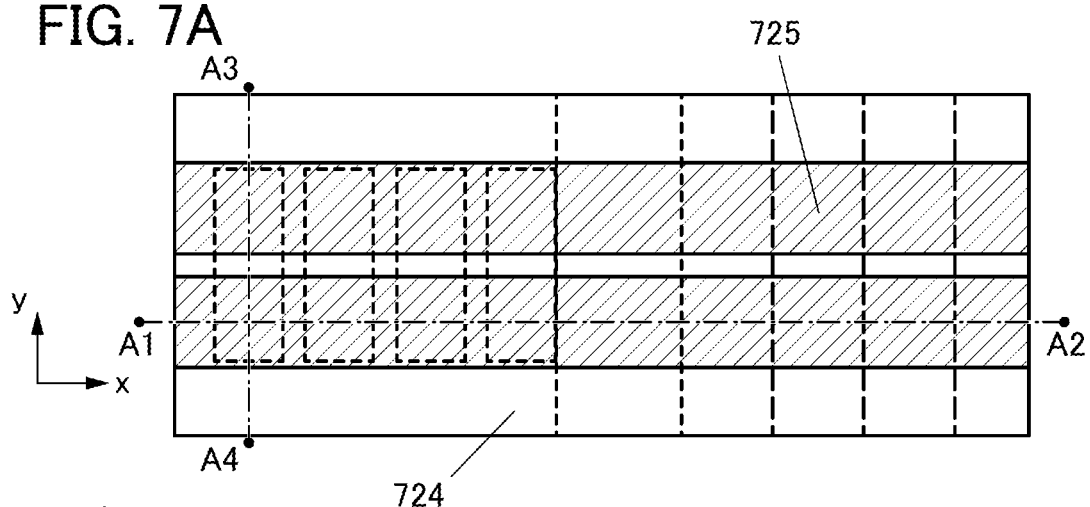
FIGS. 7A to 7C are top view and cross-sectional views illustrating a process of fabricating a semiconductor device according to one embodiment of the present invention.
Figure 7B:
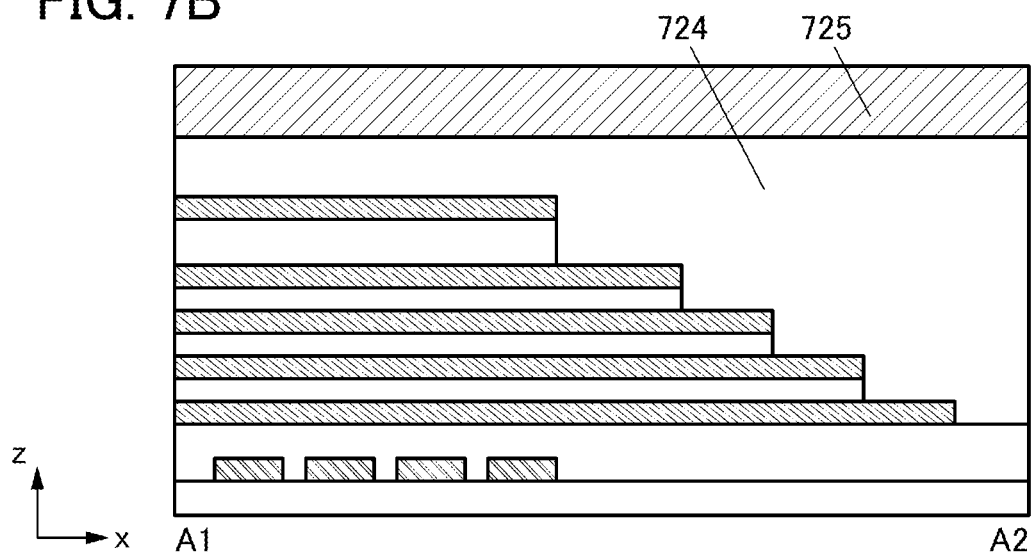
Figure 7C:
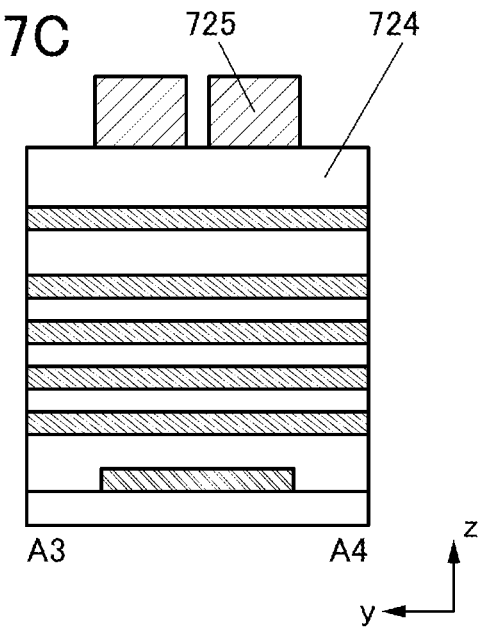
Figure 8A:
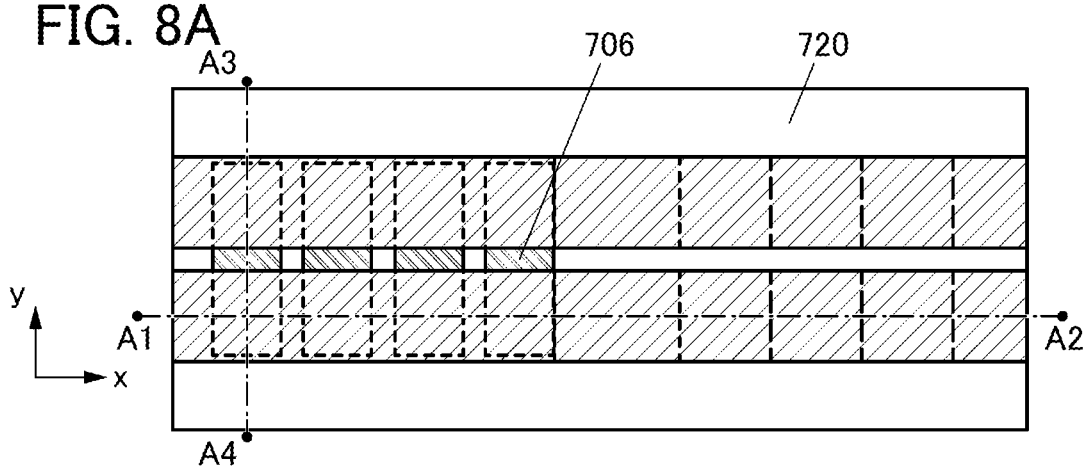
FIGS. 8A to 8C are top view and cross-sectional views illustrating a process of fabricating a semiconductor device according to one embodiment of the present invention.
Figure 8B:
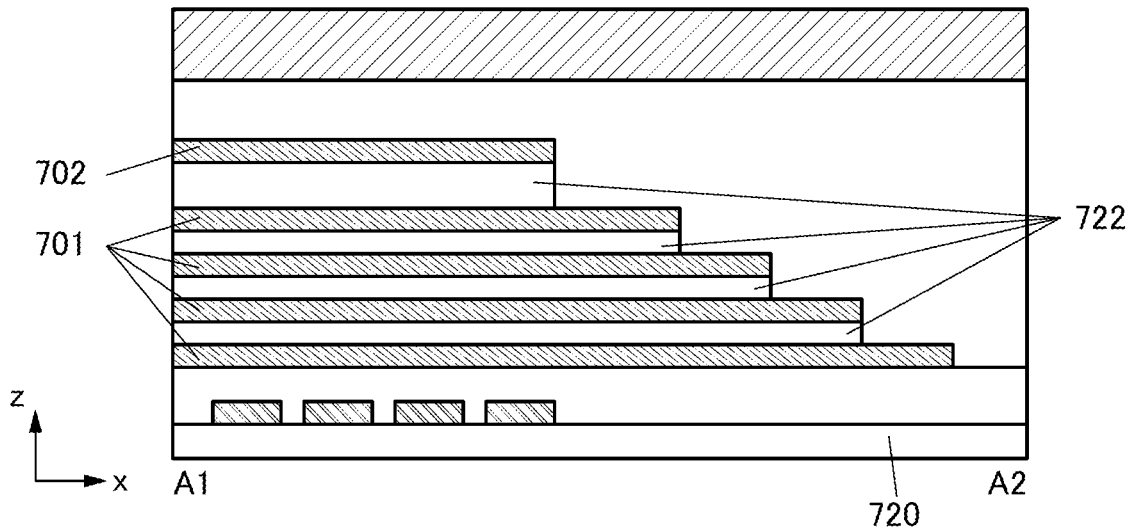
Figure 8C:
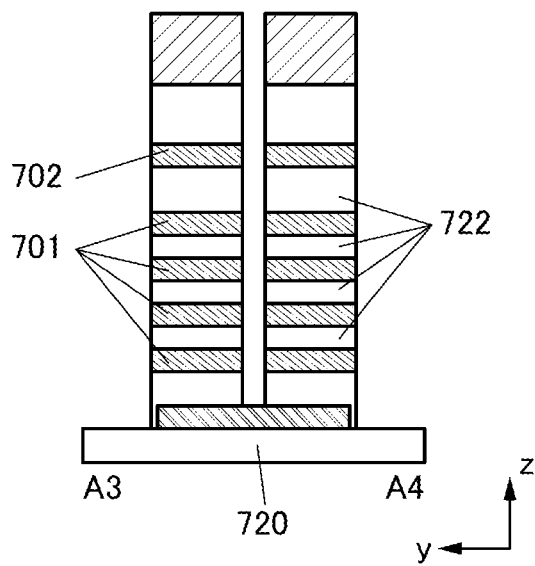

Next, the conductive film 702A, the conductive film 701A, and the insulating film 722A are processed to form a conductive film 701B, a conductive film 702B, and an insulating film 722B which have a step-like shape as illustrated in FIG. 6B. In the processing of the conductive film 702A, the conductive film 701A, and the insulating film 722A, etching of the conductive film 702A, the conductive film 701A, and the insulating film 722A and slimming of the mask 723 are alternately performed, whereby the conductive film 701B, the conductive film 702B, and the insulating film 722B which have a step-like shape can be formed. By the processing of the conductive film 702A, the conductive film 701A, and the insulating film 722A, the mask 723 is reduced in width and thickness to be a mask 723A (see FIGS. 6A to 6C).

Then, the mask 723A is removed, and an insulating film 724 is formed. The insulating film 724 can be formed by a CVD method. The insulating film 724 is preferably subjected to planarization treatment by a CMP method or a reflow method. Next, a mask 725 is formed over the insulating film 724. The mask 725 is formed over the planarized insulating film 724, whereby the accuracy of lithography is improved (see FIGS. 7A to 7C).

Then, the insulating film 724, the conductive film 702B, the conductive film 701B, the insulating film 722B, and the insulating film 721 are processed with the mask 725. By the processing, the conductor 701 which functions as the gate of the memory transistor and is electrically connected to the word line, and the conductor 702 which functions as the gate of the selection transistor are formed. In addition, the insulating film 722B is processed into an insulator 722 (see FIGS. 8A to 8C).

Next, the mask 725 is removed, and an insulator 726 is formed to be embedded in the portions in the insulating film 724, the conductive film 702B, the conductive film 701B, the insulating film 722B, and the insulating film 721, which are removed by the above processing. The insulator 726 can be formed by a CVD method or an ALD method. It is particularly preferable to employ an ALD method, in which case a film with a uniform thickness can be formed in a groove or an opening portion having a large aspect ratio. Alternatively, the insulator 726 may be formed by a combination of an ALD method and a CVD method. The insulator 726 is preferably subjected to planarization treatment by a CMP method or a reflow method. In the case where the planarization treatment is performed by a CMP method, the insulator 726 may be polished until a surface of the insulating film 724 is exposed. Alternatively, the insulating film 724 and the insulator 726 may be polished together. In this case, the thickness of the insulating film 724 becomes small.

Next, the insulating film 724 is processed by a lithography method to form a first opening so that the conductor 701 is exposed. The first opening is formed to expose each of the conductors 701 formed in a step-like shape. Although not illustrated, an opening exposing the conductor 702 may be formed at the same time (see FIGS. 9A to 9C).

Next, the conductor 707 is formed to fill the first opening. The conductor 707 can be formed by a CVD method or an ALD method. It is particularly preferable to employ an ALD method, in which case a film with a uniform thickness can be formed in a groove or an opening portion having a large aspect ratio. Alternatively, the conductor 707 may be formed by a combination of an ALD method and a CVD method. The conductor 707 may have a stacked-layer structure composed of a plurality of layers. The conductor 707 can be formed in such a manner that a conductive film to be the conductor 707 is formed over the insulating film 724 and inside the first opening and an unnecessary conductive film is removed by CMP or the like.

Figure 10A:
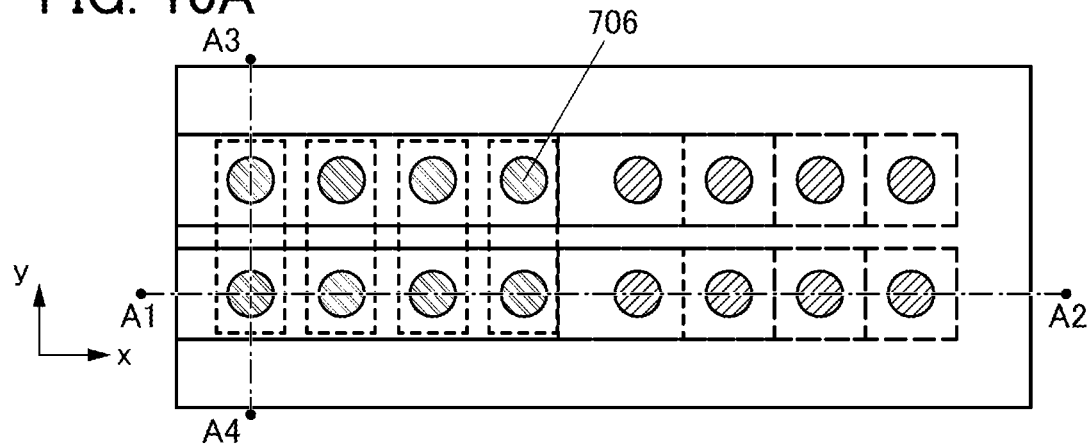
FIGS. 10A to 10C are top view and cross-sectional views illustrating a process of fabricating a semiconductor device according to one embodiment of the present invention.
Figure 10B:
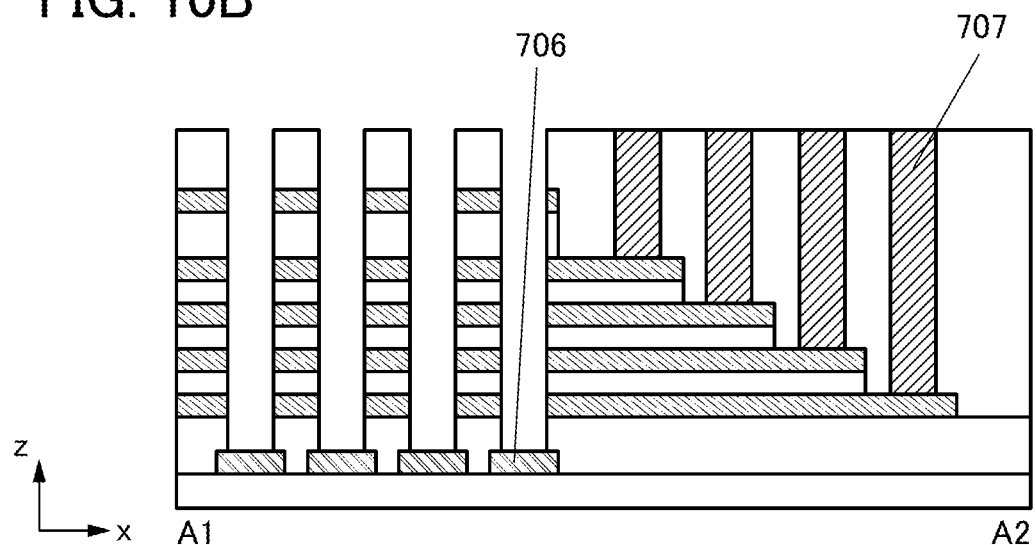
Figure 10C:
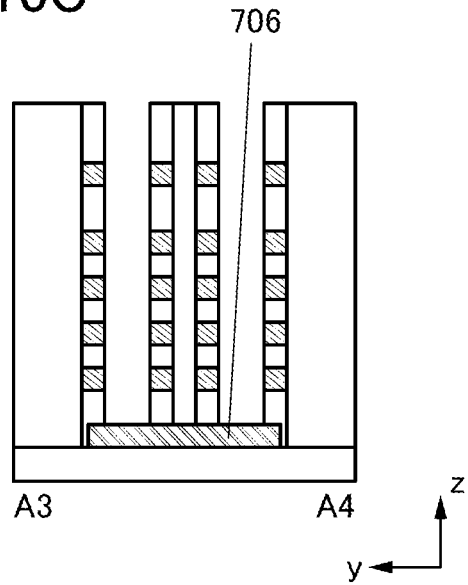

Next, the insulating film 724, the conductor 702, the conductor 701, the insulator 722, and the insulating film 721 are processed by a lithography method, and second openings are formed to expose the conductor 706 (FIGS. 10A to 10C).

Figure 11A:
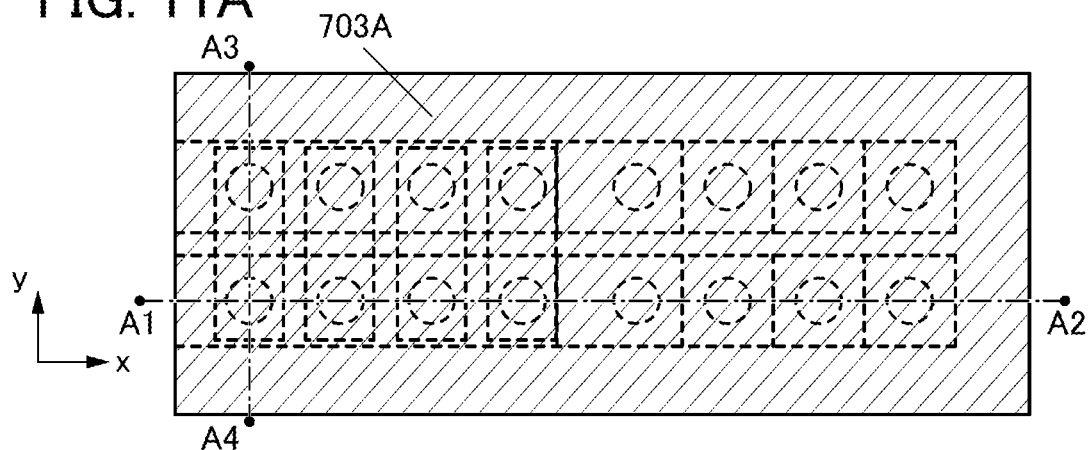
FIGS. 11A to 11C are top view and cross-sectional views illustrating a process of fabricating a semiconductor device according to one embodiment of the present invention.
Figure 11B:
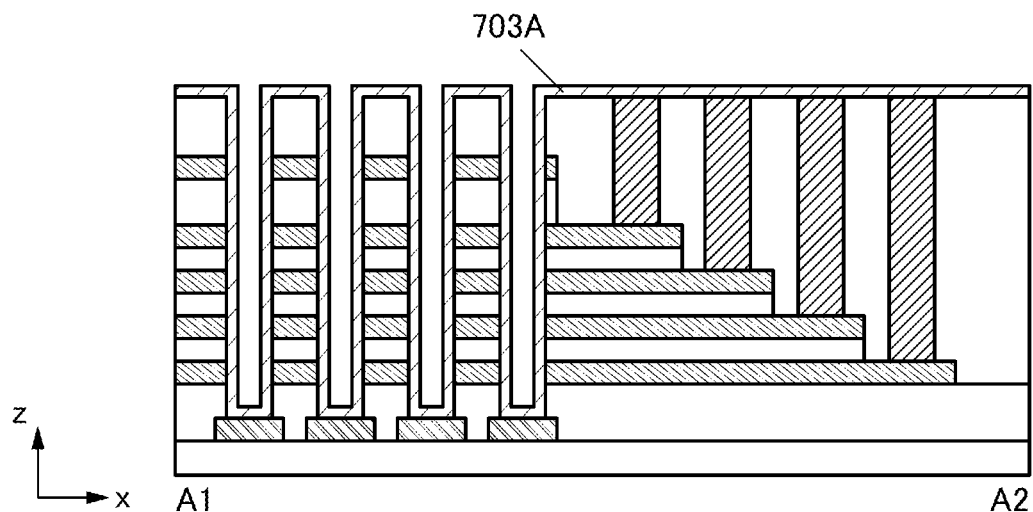
Figure 11C:
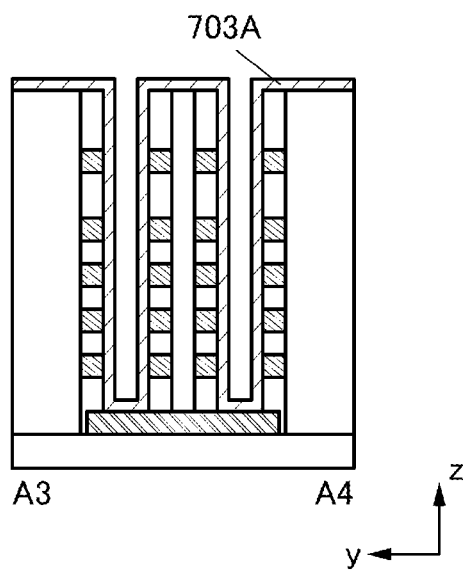
Figure 12A:
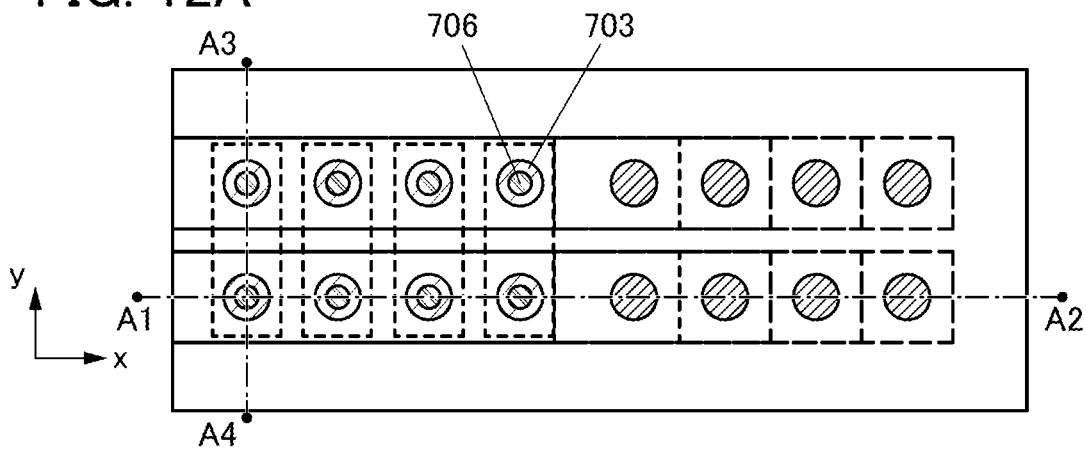
FIGS. 12A to 12C are top view and cross-sectional views illustrating a process of fabricating a semiconductor device according to one embodiment of the present invention.
Figure 12B:
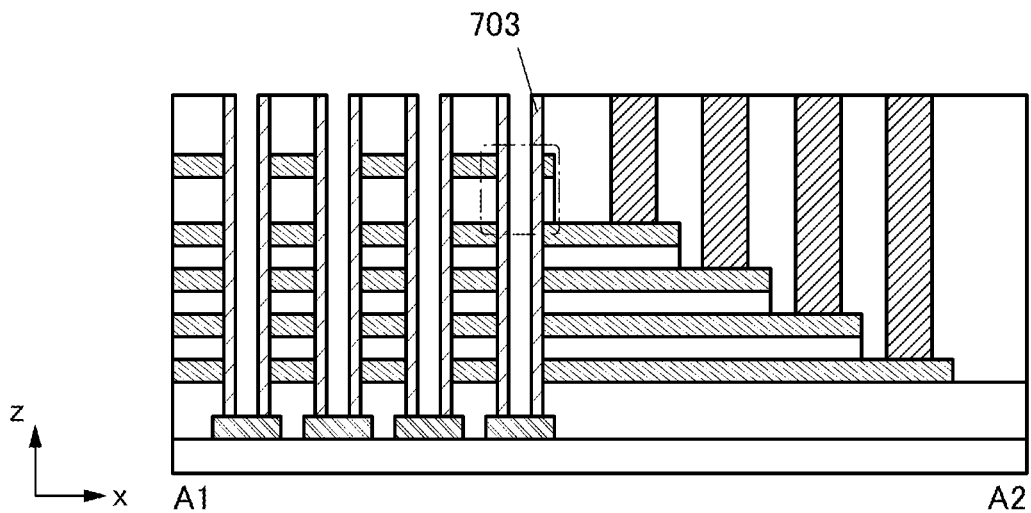
Figure 12C:
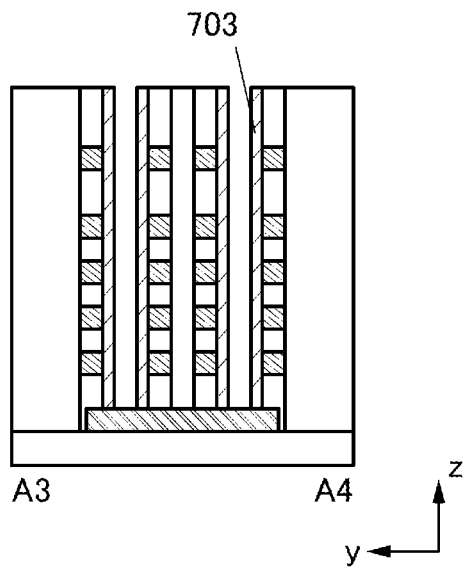
Figure 12D:
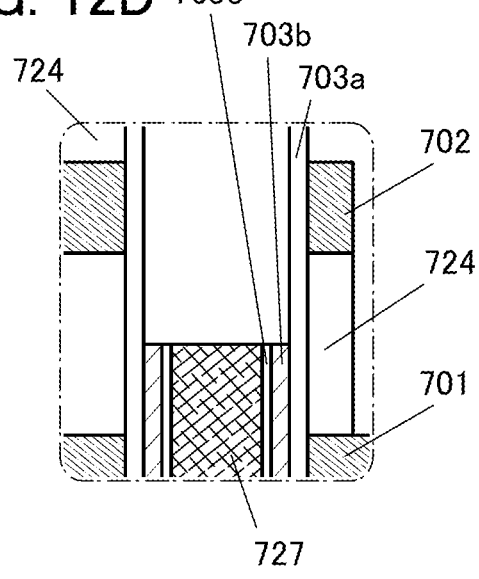

Next, an insulating film 703A to be the insulator 703 is formed over the insulating film 724 and the conductor 707 and inside the second opening (see FIGS. 11A to 11C). Although not illustrated, the insulating film 703A is formed by stacking an insulating film to be the insulator 703a, an insulating film to be the insulator 703b, and an insulating film to be the insulator 703c in this order. The insulating film 703A can be formed by a CVD method or an ALD method. It is particularly preferable to employ an ALD method, in which case a film with a uniform thickness can be formed in a groove or an opening portion having a large aspect ratio. Alternatively, the insulating film 703A may be formed by a combination of an ALD method and a CVD method. The insulating film to be the insulator 703a, the insulating film to be the insulator 703b, and the insulating film to be the insulator 703c may be formed using the same deposition apparatus or different deposition apparatuses. The insulating film to be the insulator 703c is preferably formed to be thinner than the insulating film to be the insulator 703a so that the insulator 703c is thinner than the insulator 703a.

Then, the insulating film 703A formed on the bottom portion of the second opening is removed, so that the insulator 703 is obtained. Anisotropic etching is preferably used to remove the insulating film 703A. At this time, the insulating film 703A over the insulating film 724 and the conductor 707 is also removed; thus, the insulator 703 is provided only on a side wall of the second opening (see FIGS. 12A to 12C). The conductor 706 is exposed again by removing the insulating film 703A on the bottom portion of the second opening.

Here, as illustrated in FIG. 12D, the insulator 703b and the insulator 703c of the insulator 703 which are positioned in the upper portion of the second opening may be removed. FIG. 12D is an enlarged view of a portion surrounded by the dashed-dotted line in FIG. 12B. First, a material 727 (also referred to as a sacrifice layer) which can be easily removed in a later step is formed to be embedded in the second opening, and removed by etching or the like to a desired depth inside the second opening. The insulator 703c and the insulator 703b exposed by the etching are removed in this order, whereby only the insulator 703a can be used as the insulator 703 positioned in the horizontal direction (x-y direction) of the conductor 702. In this case, the gate insulating film of each of the selection transistors SST and SDT is formed of the insulator 703a. After the insulator 703c and the insulator 703b are removed, the material 727 is removed.

Next, the oxide 704 is formed inside the second opening. The oxide 704 can be formed in such a manner that an oxide to be the oxide 704a and an oxide to be the oxide 704b are formed in this order over the insulating film 724, the conductor 707, and the insulator 703 and inside the second opening, and an unnecessary oxide is removed by a CMP method or the like (see FIGS. 13A to 13C).

Figure 13A:
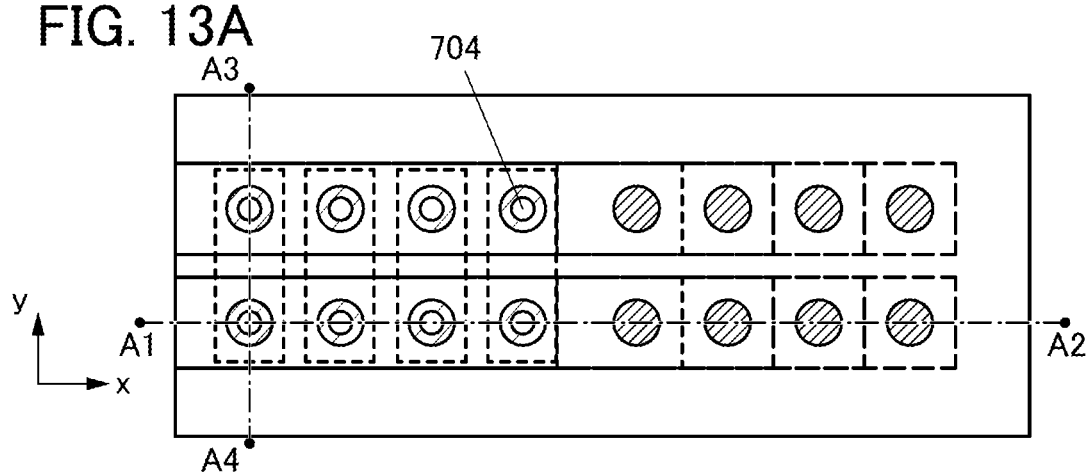
FIGS. 13A to 13D are top view and cross-sectional views illustrating a process of fabricating a semiconductor device according to one embodiment of the present invention.
Figure 13B:
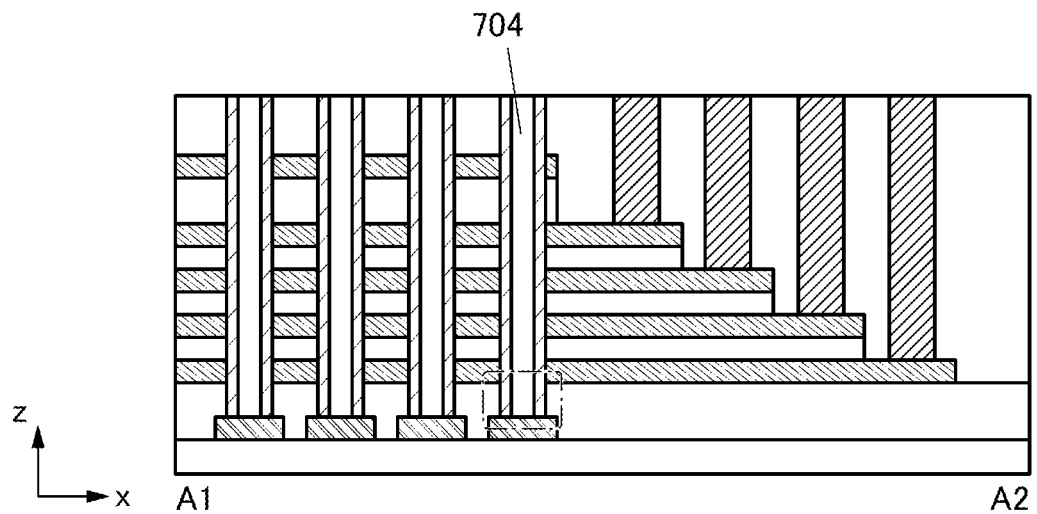
Figure 13C:
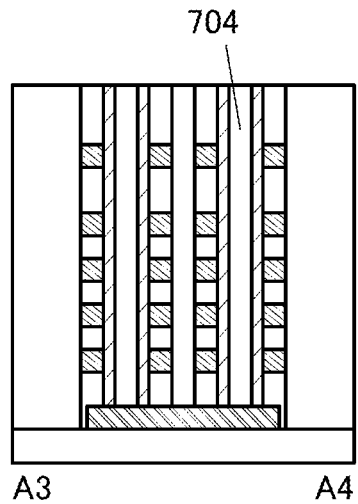
Figure 13D:
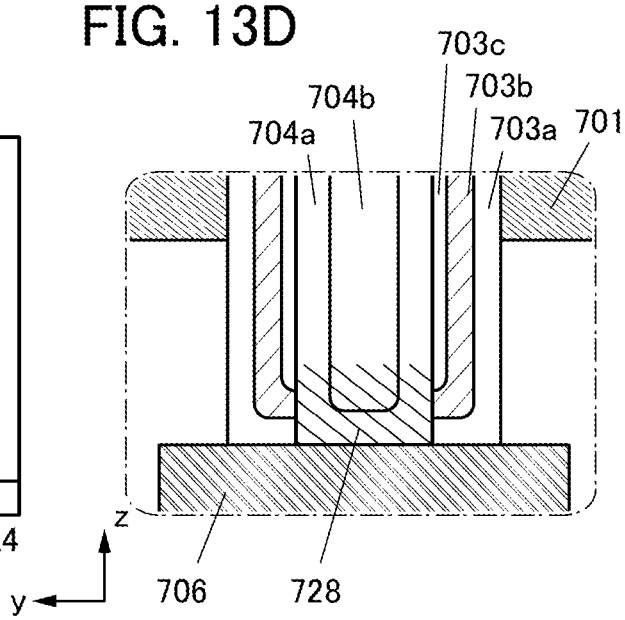

FIG. 13D is an enlarged view of a portion surrounded by the dashed-dotted line in FIG. 13B. FIG. 13D shows an example in which the oxide 704 has a two-layer structure of the oxide 704a and the oxide 704b; however, the present invention is not limited thereto. As illustrated in FIG. 2B, the oxide 704 may have a three-layer structure of the oxide 704a, the oxide 704b, and the oxide 704c or a stacked-layer structure of four or more layers.

The oxide 704 can be formed by a CVD method, an ALD method, or a sputtering method. It is particularly preferable to employ an ALD method, in which case a film with a uniform thickness can be formed in a groove or an opening portion having a large aspect ratio. It is particularly preferable to employ an ALD method, in which case a film with a uniform thickness can be formed in a groove or an opening portion having a large aspect ratio. Alternatively, the oxide 704 may be formed by a combination of an ALD method and a CVD method. The oxide to be the oxide 704a, the oxide to be the oxide 704b, and the oxide to be the oxide 704c may be formed using the same deposition apparatus or different deposition apparatuses.

The insulator 711 may be formed on the inner side of the oxide 704b as illustrated in FIG. 2B in the case where the oxide 704 has a two-layer structure of the oxide 704a and the oxide 704b, or may be formed on the inner side of the oxide 704c in the case where the oxide 704 has a three-layer structure of the oxide 704a, the oxide 704b, and the oxide 704c.

For the insulator 711, a material that supplies oxygen to the oxide 704 or a material that supplies hydrogen can be used in accordance with the characteristics needed for the memory transistors and the semiconductor device including the memory transistor.

The oxide 704 is formed in contact with the conductor 706. When the oxide 704 is in contact with the conductor 706, a metal compound layer containing a metal element included in the conductor 706 and the component of the oxide 704 is formed at the interface between the conductor 706 and the oxide 704 in some cases. The metal compound is preferably formed, in which case the contact resistance between the conductor 706 and the oxide 704 can be reduced. Oxygen contained in a region 728 of the oxide 704 is absorbed by the conductor 706 in some cases, which is preferred because, at this time, the resistance of the oxide 704 in the vicinity of the interface between the conductor 706 and the oxide 704 is reduced, so that the contact resistance between the conductor 706 and the oxide 704 is reduced. When the heat treatment is performed in the state where the oxide 704 and the conductor 706 are in contact with each other, the oxide 704 has lower resistance and the contact resistance between the conductor 706 and the oxide 704 is further reduced. The heat treatment is preferably performed in an atmosphere containing nitrogen at 200° C. to 500° C. inclusive, preferably 300° C. to 400° C. inclusive.

In the following steps, the conductor 705 or the like is formed in accordance with the circuit configuration. Through the above steps, the memory cell array can be manufactured. In the description of this manufacturing process, the memory cell array includes four layers of the memory transistors and four memory strings; however, the present invention is not limited thereto. Five or more layers of the memory transistors may be included. Five or more memory strings may be included. For example, a memory cell array including 32 layers, 64 layers, or 128 layers of the memory transistors can be manufactured. A memory cell array including 200 or more layers of the memory transistors can be manufactured.

The memory cell array is manufactured in the above manner, whereby a plurality of layers of the memory transistors can be formed at a time without pattern formation for manufacturing the memory transistors for each layer. In the case where the memory cell array is manufactured by the above method, even when the number of layers of the memory transistors is increased, the number of steps of pattern formation and etching treatment of the memory transistors is not increased. In this manner, the number of manufacturing steps of the memory cell array can be reduced; thus, a semiconductor device with high productivity can be provided.

Configuration Example of 3D NAND

Figure 14A:
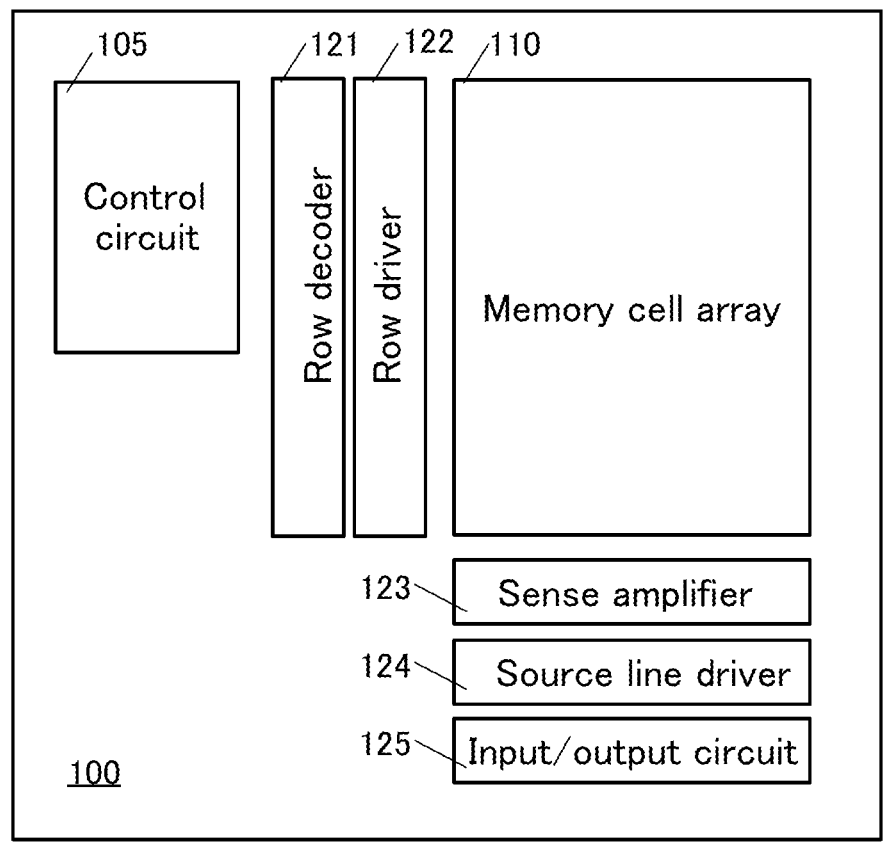
FIG. 14 is a functional block diagram illustrating a configuration example of a memory device according to one embodiment of the present invention and FIG. 14B is a circuit diagram illustrating a configuration example of a memory string.

FIG. 14A illustrates a configuration example of a three-dimensional NAND-type nonvolatile memory device (3D NAND). A memory device 100 illustrated in FIG. 14A includes a control circuit 105, a memory cell array 110, and peripheral circuits.

The control circuit 105 controls the memory device 100 collectively, and writes data and reads out data. The control circuit 105 processes a command signal from the outside and generates a control signal for the peripheral circuits. As the peripheral circuits, a row decoder 121, a row driver 122, a sense amplifier 123, a source line driver 124, and an input/output circuit 125 are provided.

Figure 14B:
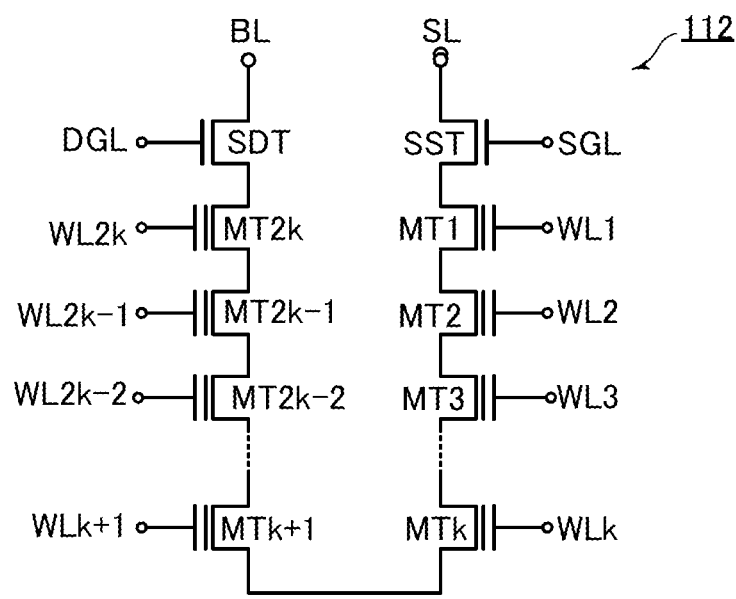

The memory cell array 110 includes a plurality of memory strings 112. FIG. 14B illustrates a circuit configuration example of the memory string 112. In the memory string 112, a selection transistor SST, memory transistors MT1 to MT2$k$ ($k$ is an integer of 1 or more), and a selection transistor SDT are electrically connected in series between the bit line BL and the source line SL.

Note that in the case where the memory transistors MT1 to MT2$k$ are not distinguished from each other, these memory transistors are collectively referred to as a memory transistor MT in some cases. The same applies to the other elements.

As described above, the selection transistors SST and SDT and the memory transistors MT1 to MT2$k$ are each a transistor in which the channel is formed of a metal oxide. The memory transistor MT includes a charge accumulation layer and forms a nonvolatile memory cell.

Gates of the selection transistors SST and SDT are electrically connected to selection gate lines SGL and DGL, respectively. Gates of the memory transistors MT1 to MT2$k$ are electrically connected to word lines WL1 to WL2$k$, respectively. The bit line BL extends in the column direction, and the selection gate lines SGL and DGL and the word line WL extend in the row direction.

The input/output circuit 125 performs temporarily holding data written to the memory cell array 110, temporarily holding data read out from the memory cell array 110, and the like.

The source line driver 124 drives the source line SL.

The bit line BL is electrically connected to the sense amplifier 123. The sense amplifier 123 detects voltage that is read out from the memory string 112 to the bit line BL at the time of data readout and amplifies it. In addition, voltage corresponding to the writing data is input to the bit line BL at the time of data writing.

The row decoder 121 decodes address data input from the outside and selects a row to be accessed. The row driver 122 inputs voltage needed for writing, reading, and erasing data to the selection signal lines DGL and SGL and the word lines WL in accordance with the decoded results by the row decoder 121.

Figure 15:
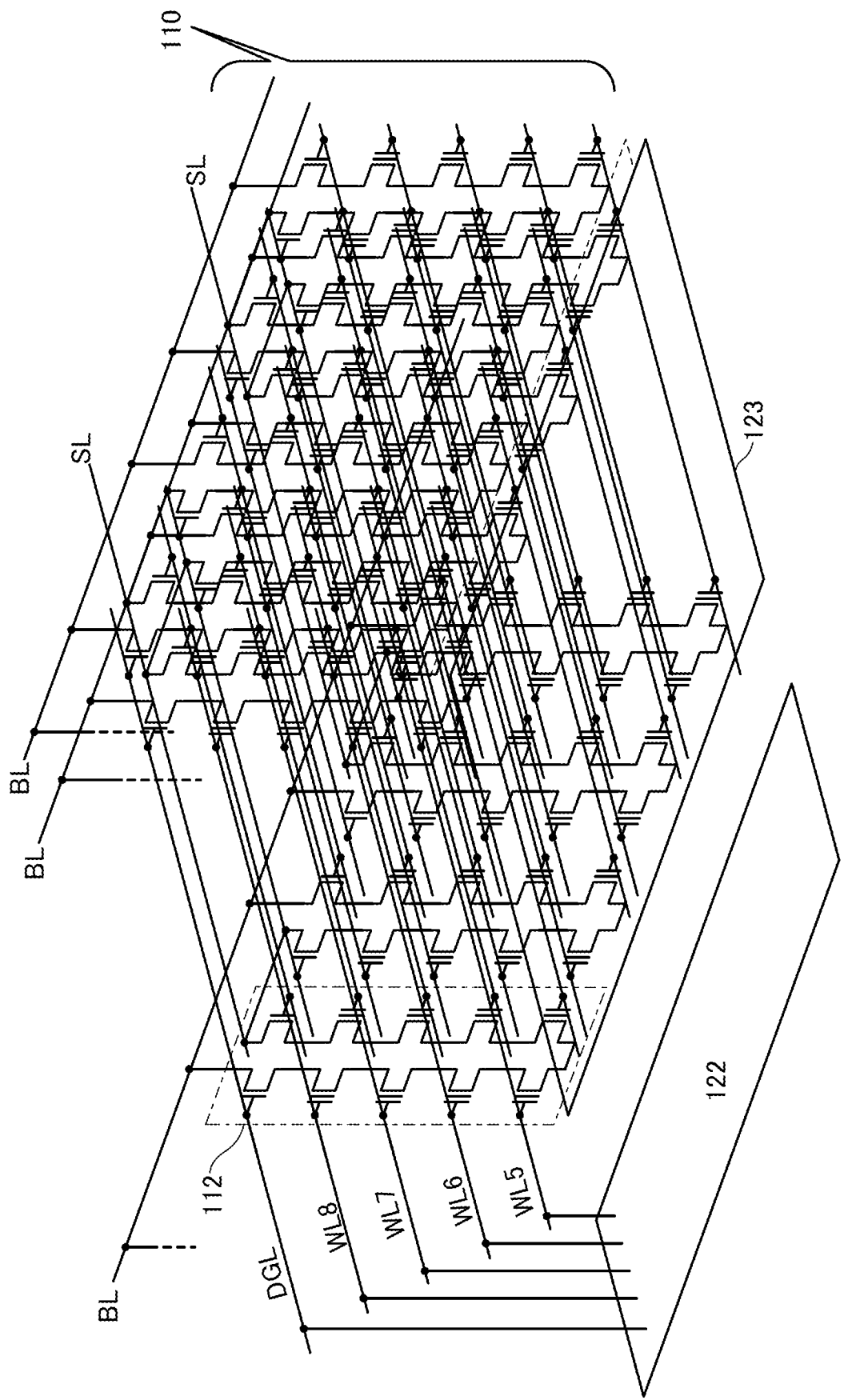
FIG. 15 is a diagram illustrating a configuration example of a three-dimensional structure of a memory cell array according to one embodiment of the present invention.
Figure 16:
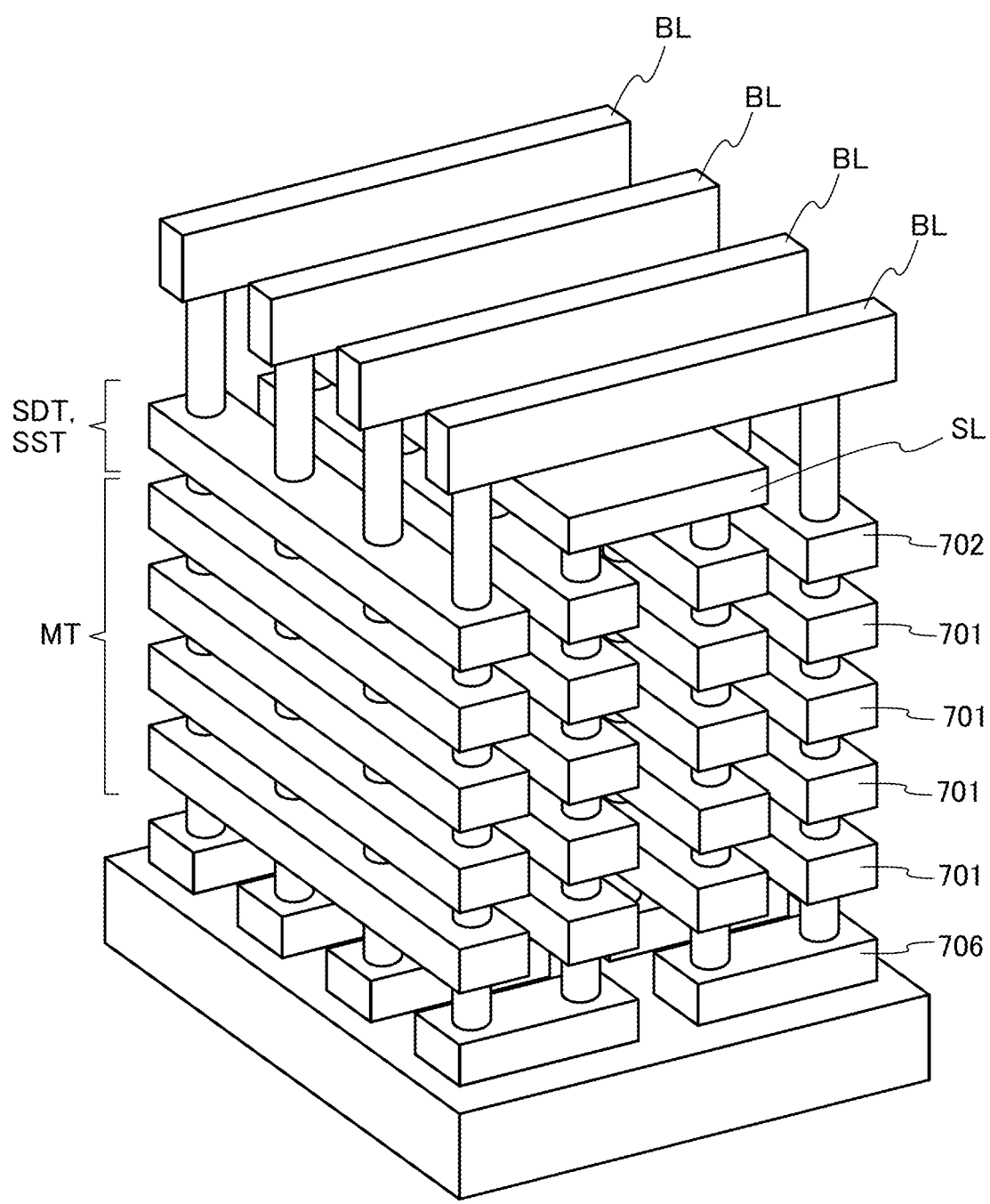
FIG. 16 is a diagram illustrating a configuration example of a three-dimensional structure of a memory cell array according to one embodiment of the present invention.
Figure 17:
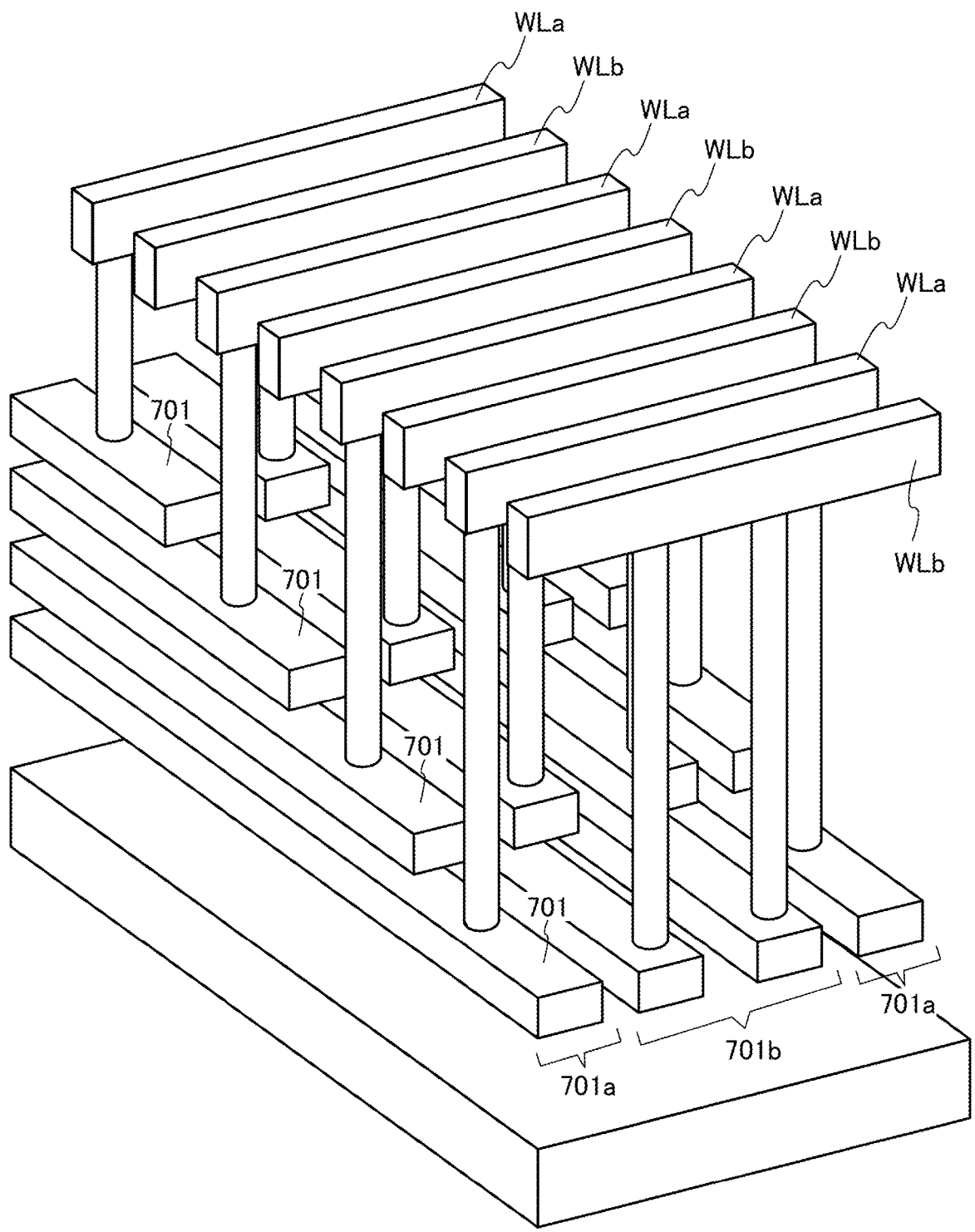
FIG. 17 is a diagram illustrating a configuration example of a three-dimensional structure of a memory cell array according to one embodiment of the present invention.

A three-dimensional stacked-layer structure example of the memory cell array 110 is illustrated in FIG. 15 to FIG. 17. FIG. 15 is a circuit diagram schematically illustrating the three-dimensional structure example of the memory cell array 110. FIG. 16 is a cross-sectional view illustrating the three-dimensional structure example of the memory cell array 110. FIG. 17 is a cross-sectional view illustrating the three-dimensional structure example of the connection portion of the word line WL and the conductor 701. As illustrated in FIG. 15, the memory cell array 110 is stacked over a region where the sense amplifier 123 is formed. Accordingly, the layout area of the memory device 100 can be reduced. As illustrated in FIG. 16 and FIG. 17, even in the conductor 701 in the same stage, the conductor 701a on the bit line BL side is connected to the word line WLa, and the conductor 701b on the source line SL side is connected to the word line WLb. Note that FIG. 15 to FIG. 17 illustrate an example in which eight memory transistors MT1 to MT8 are provided in one memory string 112.

Description of Circuit Operation of Memory Device

Next, operation of writing and reading out data to/from the memory string 112 is described with reference to FIGS. 18A to 18C. The memory transistors MT sharing the word line WL1 to the word line WL2k are collectively called a page below.

Figure 18A:
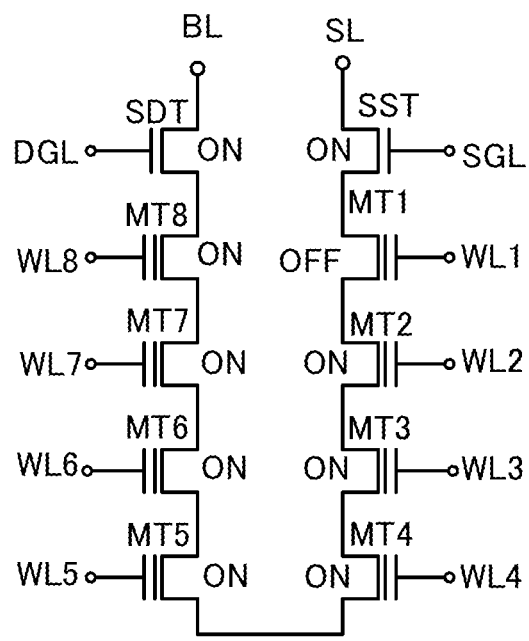
FIGS. 18A to 18C are circuit diagrams illustrating an operation of a memory device according to one embodiment of the present invention.
Figure 18B:
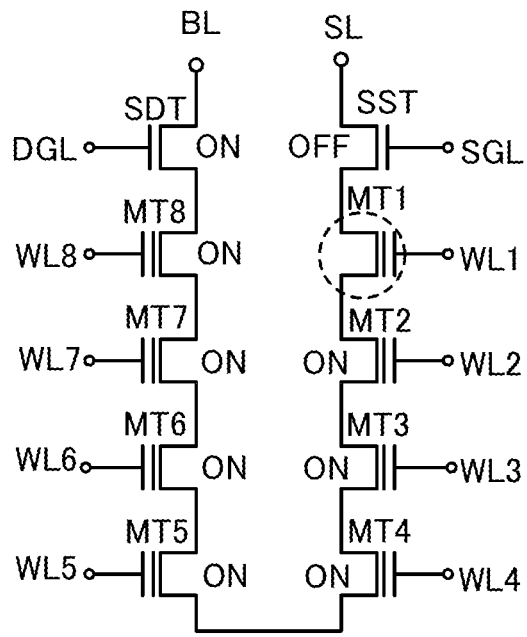
Figure 18C:
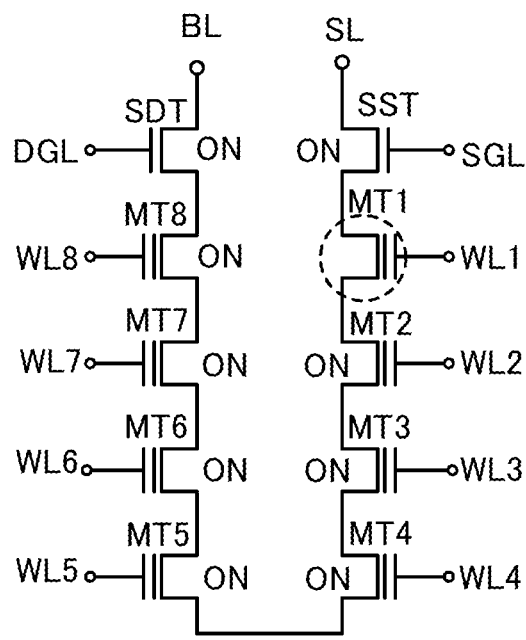

Although the memory string 112 includes the memory transistors MT1 to MT8 as an example in FIGS. 18A to 18C, the number of memory transistors MT is not limited to this.

Erasing Operation

In the case where data is written to the memory transistor MT, data is preferably erased before the writing operation. The operation of erasing data is also referred to as a reset operation in some cases. The erasing operation may be performed by sequentially selecting the memory transistors MT with the data to be erased, for example. First, a low potential (a potential for extracting electrons accumulated in the charge accumulation layer, e.g., −18 V) is applied to the word line WL connected to the gate of the memory transistor MT with the data to be erased, and a positive potential (a potential at which the transistor becomes conductive, e.g., 3 V) is applied to the word line WL other than the word line WL. An erasing potential VE (e.g., 0 V) is applied to the source line SL and the bit line BL, and the selection transistor SDT and the selection transistor SST are made conductive, whereby the data in the desired memory transistor MT can be erased. As illustrated in FIG. 18A, the memory transistor MT1 is made non-conductive by applying a low potential to the word line WL1, the memory transistors MT2 to MT8 are made conductive by applying positive potentials to the word lines WL2 to WL8, and the selection transistor SDT and the selection transistor SST are made conductive by applying erasing potentials VE to the source line SL and the bit line BL, whereby the data in the memory transistor MT1 can be erased. Subsequently, the word lines WL2 to WL8 are sequentially selected, a low potential is applied to the selected word line WL, and a positive potential is applied to the other word lines WL, whereby data in the memory transistors MT1 to MT8 can be erased. Through the erasing operation (reset operation), electrons accumulated in the charge accumulation layer of each of the memory transistors MT1 to MT8 can be extracted. Accordingly, the memory transistors MT1 to MT8 hold data "1". The erasing operation does not need to be performed on all the memory transistors MT and only the memory transistors MT with the data to be erased may be selected and the data may be erased. For example, the erasing operation may be performed on only the memory transistor MT to which data "0" has been written.

The erasing operation is not limited to the above-described method. In the case where the memory transistor MT is a normally-on type, data can be erased for each memory string 112 (also referred to as a block). For example, a low potential (e.g., 0 V) is applied to the word lines WL connected to all the gates of the memory transistors MT of blocks with data to be erased, and a high potential (e.g., +18 V) is supplied to the source line SL and the bit line BL. Through such an operation, electrons accumulated in the charge accumulation layer of each of the memory transistors MT1 to MT8 can be extracted at the same time.

Note that data in the memory transistor MT which is not subjected to data rewriting is preferably stored in a different memory region in advance of the erasing operation of the block.

Writing Operation

Next, the data writing operation is described with reference to FIG. 18B.

The data writing operation can be performed for each of the above pages. First, a writing potential (e.g., 15 V) is applied to a word line of a page subjected to writing, and then a positive potential (a potential at which a transistor becomes conductive, e.g., 3 V) is applied to a word line of a page which is not subjected to writing. As shown in FIG. 18B, a writing potential is applied to the word line WL1 first, and then positive potentials are applied to the word lines WL2 to WL8. Then, the selection transistor SST is brought into a non-conduction state and a positive potential is applied to the selection transistor SDT to bring the selection transistor SDT into a conduction state. Thus, data corresponding to the potential of the bit line BL is written to the memory transistor MT1. Specifically, when a potential of the bit line BL is a low potential (e.g., 0 V), as a potential difference from the writing potential applied to the word line WL1 increases, electrons are injected into the charge accumulation layer of the memory transistor MT1. In the case where the potentials of the selection transistors SDT and the bit line BL are both positive potentials, the selection transistor SDT becomes non-conductive. At this time, the memory transistor MT is brought into an electrically floating state, so that electrons are not injected into the charge accumulation layer of the memory transistor MT1. That is, when the low potential is applied to the bit line BL, data "0" is written to the memory transistor MT1, and when the positive potential is applied, the data in the memory transistor MT1 remains "1".

Data writing can be performed page by page in such a manner that different potentials are applied to the bit lines BL in the memory strings 112.

Multilevel data can be written to the memory transistor MT. For example, the amount of charges injected into the charge accumulation layer of the memory transistor is controlled in accordance with a potential of the bit line BL or the like or a potential applying period.

Readout Operation

Then, a data readout operation is described with reference to FIG. 18(C).

A data readout operation can also be performed for each of the pages. First, positive potentials (potentials at which a transistor becomes conductive, e.g., 3 V) are applied to a word lines of a page subjected to readout and a page which is not subjected to readout. Here, positive potentials are applied to the word lines WL1 to WL8, as illustrated in FIG. 18C. Then, the selection transistor SDT and the selection transistor SST are brought into a conduction state. A readout potential (e.g., 1 V) is applied to the bit line BL, and a low potential (e.g., 0 V) is applied to the source line SL. At this time, when the data in the memory transistor MT1 is "1", current flows to the memory string 112, so that the potential of the bit line BL decreases. When the data in the memory transistor MT1 is "0", current does not flow to the memory string 112 and the potential of the bit line BL does not change. The sense amplifier 123 detects the potential of the bit line BL and amplifies it. Through the above steps, data in the memory string 112 can be read out.

Data in each of the memory strings 112 is read out to the bit line BL; thus, data per page can be read out.

The structure described in this embodiment can be used in appropriate combination with the structures described in the other embodiments.

Embodiment 2

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to removable memory devices such as memory cards (e.g., SD cards), USB memories, and SSDs (solid state drives). FIG. 19A to 19E schematically illustrate some structural examples of removable memory devices. A packaged memory chip including the semiconductor device described in the above embodiment is used in a variety of storage devices and removable memories, for example.

Figure 19A:
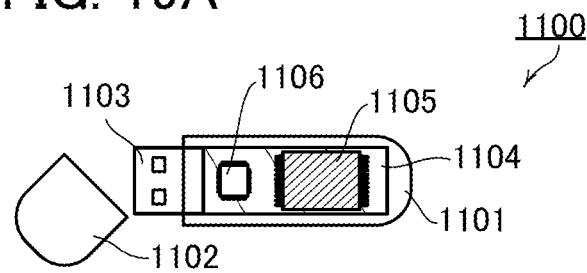
FIGS. 19A to 19E are schematic views of a memory device according to one embodiment of the present invention.

FIG. 19A is a schematic diagram of a USB memory. A USB memory 1100 includes a housing 1101, a cap 1102, a USB connector 1103, and a substrate 1104. The substrate 1104 is stored in the housing 1101. The substrate 1104 is provided with a memory chip 1105 and a controller chip 1106, for example. The semiconductor device described in the above embodiment can be incorporated in the memory chip 1105 or the like on the substrate 1104.

Figure 19B:
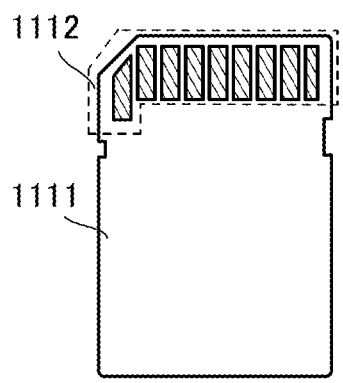
Figure 19C:
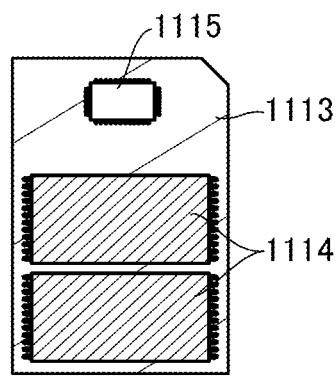

FIG. 19B is an external schematic diagram of an SD card, and FIG. 19C is a schematic diagram illustrating the internal structure of the SD card. An SD card 1110 includes a housing 1111, a connector 1112, and a substrate 1113. The substrate 1113 is stored in the housing 1111. The substrate 1113 is provided with a memory chip 1114 and a controller chip 1115, for example. When the memory chip 1114 is also provided on a back side of the substrate 1113, the capacity of the SD card 1110 can be increased. A wireless chip with a radio communication function may be provided on the substrate 1113. With this, the memory chip 1114 can read out and write data by radio communication between a host device and the SD card 1110. The semiconductor device described in the above embodiment can be incorporated in the memory chip 1114 or the like on the substrate 1113.

Figure 19D:
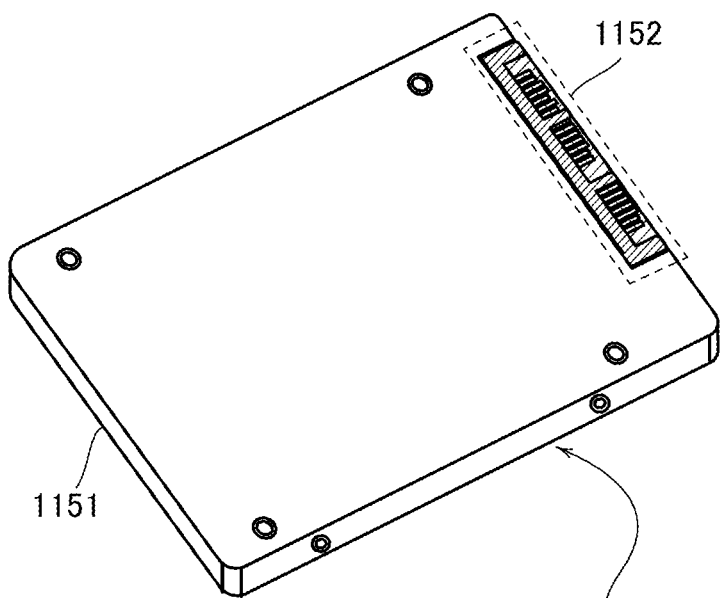
Figure 19E:
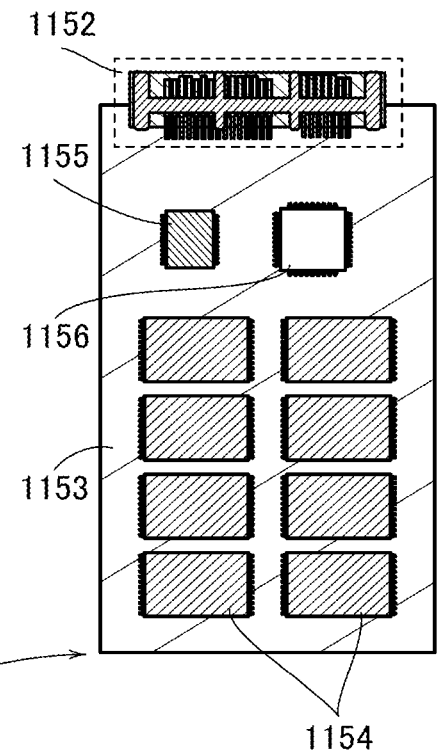

FIG. 19D is an external schematic diagram of an SSD, and FIG. 19E is a schematic diagram illustrating the internal structure of the SDD. An SSD 1150 includes a housing 1151, a connector 1152, and a substrate 1153. The substrate 1153 is stored in the housing 1151. The substrate 1153 is provided with a memory chip 1154, a memory chip 1155, and a controller chip 1156, for example. The memory chip 1155 is a work memory of the controller chip 1156, and a DRAM chip is used, for example. When the memory chip 1154 is also provided on a back side of the substrate 1153, the capacity of the SSD 1150 can be increased. The semiconductor device described in the above embodiment can be incorporated in the memory chip 1154 or the like on the substrate 1153.

The structure described in this embodiment can be used in appropriate combination with the structures described in the other embodiments.

Embodiment 3

In this embodiment, an AI system in which the semiconductor device described in the above embodiments is used will be described with reference to FIG. 20.

Figure 20:
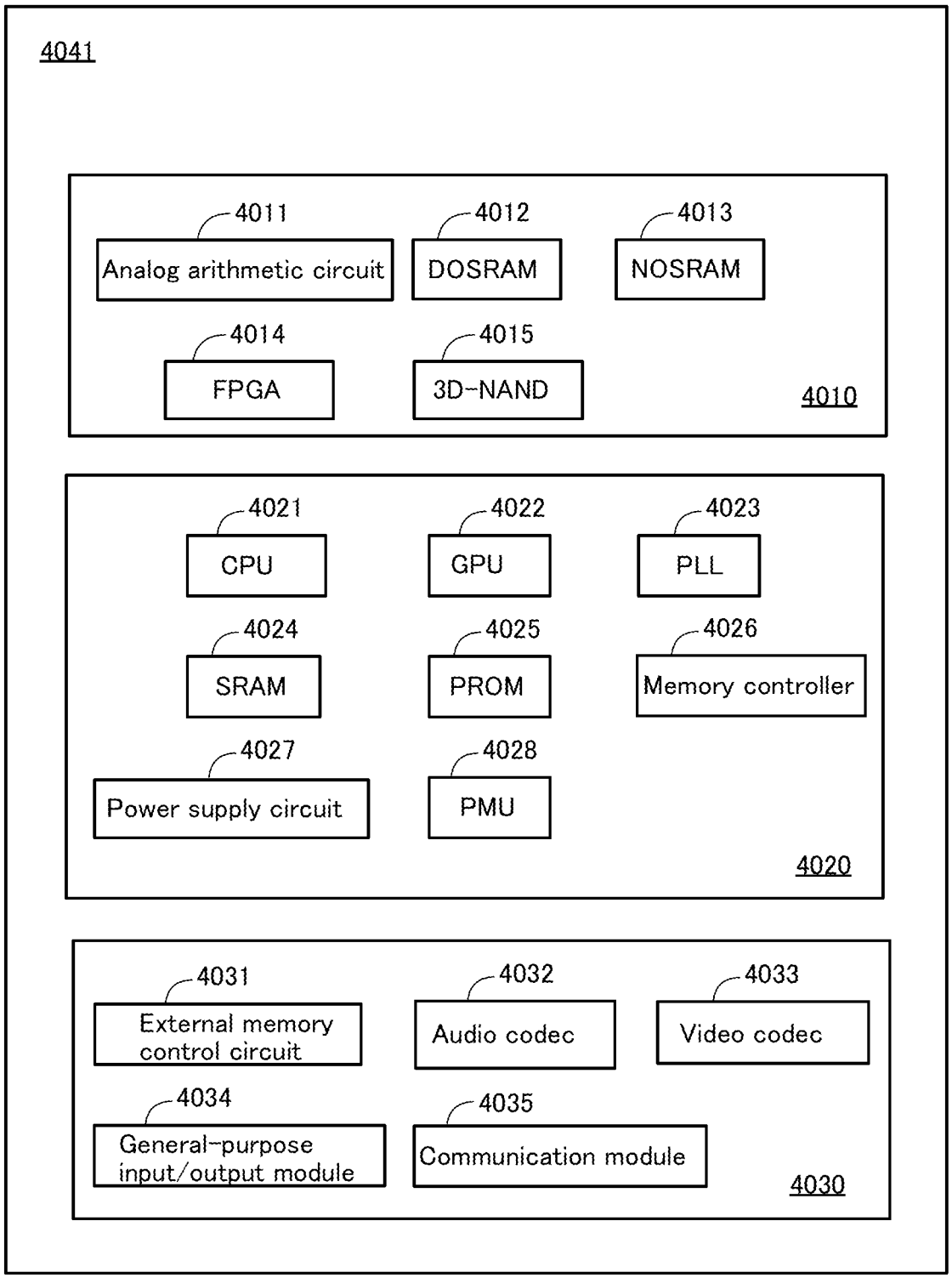
FIG. 20 is a block diagram illustrating a structure example of an AI system according to one embodiment of the present invention.

FIG. 20 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, an FPGA 4014, and a 3D-NAND 4015.

The term DOSRAM (registered trademark) is an abbreviation of "Dynamic Oxide Semiconductor RAM", which indicates a RAM including 1T (transistor) and 1C (capacitor).

NOSRAM (registered trademark) is an abbreviation of nonvolatile oxide semiconductor RAM, which is RAM including a gain cell (2T or 3T) memory cell. DOSRAM and NOSRAM are memories utilizing a low off-state current of a transistor using an oxide in a semiconductor (hereinafter, referred to as an OS transistor). Note that hereinafter, a memory device using an OS transistor, such as the NOSRAM, is referred to as an OS memory in some cases.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can perform learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in the SRAM, the input data has to be stored piece by piece because of the circuit area limitation and small storage capacity of the SRAM. The DOSRAM 4012 has a larger storage capacity than the SRAM because memory cells can be highly integrated even in a limited circuit area. Therefore, the DOSRAM 4012 can efficiently store the input data.

The NOSRAM 4013 is a nonvolatile memory including an OS transistor. The NOSRAM 4013 consumes less power in writing data than the other nonvolatile memories such as a flash memory, a ReRAM (Resistive Random Access Memory), and an MRAM (Magnetoresistive Random Access Memory). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are not necessarily provided. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA using an OS transistor. By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with a hardware. The connection of the neural network with a hardware enables higher speed performance.

The FPGA 4014 is an FPGA including a transistor. An OS-FPGA can have a smaller memory area than an FPGA formed of an SRAM. Thus, adding a context switching function only causes a small increase in area. Moreover, an OS-FPGA can transmit data and parameters at high speed by boosting.

The 3D-NAND 4015 is a nonvolatile memory using an oxide semiconductor. The 3D-NAND 4015 is a highly integrated memory in which the storage capacity per unit area is large.

The 3D-NAND 4015 can store multilevel data of two or more bits as well as one-bit binary data. The multilevel data storage in the 3D-NAND 4015 can further reduce the memory cell area per bit.

As the 3D-NAND 4015, for example, the semiconductor device described in the above embodiment can be used. This can reduce the area occupied by the memory cell, and accordingly the 3D-NAND 4015 can be more highly integrated. Thus, the storage capacity per unit area of the 3D-NAND 4015 can be increased.

In the AI system 4041, the analog arithmetic circuit 4011, the DOSRAM 4012, the NOSRAM 4013, and the FPGA 4014 can be provided on one die (chip). Thus, the AI system 4041 can perform calculation of the neural network quickly with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 does not need to include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013 or the 3D-NAND 4015. The 3D-NAND 4015, which is a highly integrated memory in which the storage capacity per unit area is large, can store a high-capacity program.

Most of the existing programs used as libraries are designed on the premise that the programs are processed by a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may use an OS memory. In that case, storing a reference potential in the OS memory can reduce the power consumption of the power supply circuit 4027.

The PMU 4028 has a function of temporarily stopping the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped.

As a result, the AI system 4041 can save the electric power.

The PLL 4023 has a function of generating a clock. The AI system 4041 performs an operation on the basis of the clock generated by the PLL 4023. The PLL 4023 preferably includes an OS memory. When an OS memory is included in the PLL 4023, an analog potential with which the clock oscillation cycle is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external memory device such as an HDD (Hard Disk Drive) or an SSD (Solid State Drive) in many cases. Therefore, the AI system 4041 preferably includes the external memory control circuit 4031 functioning as an interface with the external memory device.

Because the neural network often deal with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a USB (Universal Serial Bus), an I2C (Inter-Integrated Circuit), or the like, for example.

The AI system 4041 can perform learning or make an inference using data obtained via the Internet. For this reason, the AI system 4041 preferably includes the communication module 4035.

The analog arithmetic circuit 4011 may include a multi-level flash memory as an analog memory. However, the flash memory has a limit on the number of rewriting times. In addition, the multi-level flash memory is extremely difficult to embed; in other words, the arithmetic circuit and the memory are difficult to form on the same die.

Alternatively, the analog arithmetic circuit 4011 may use a ReRAM as an analog memory. However, the ReRAM has a limit on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may include an MRAM as an analog memory. However, the MRAM has a problem in storage accuracy because of its low magnetoresistive ratio.

In consideration of the above, an OS memory is preferably used as an analog memory in the analog arithmetic circuit 4011.

The structure described in this embodiment can be used in appropriate combination with the structures described in the other embodiments.

Embodiment 4

Application Example of AI System

In this embodiment, application examples of the AI system described in the above embodiment will be described with reference to FIG. 21A and 21B.

Figure 21A:
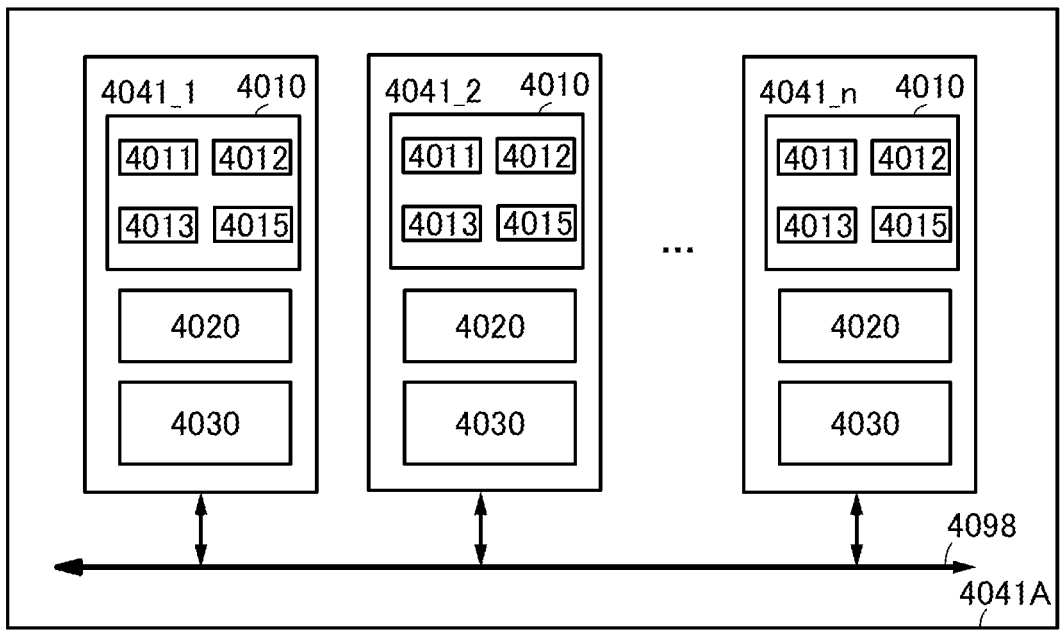
FIGS. 21A and 21B are block diagrams illustrating application examples of an AI system according to one embodiment of the present invention.

FIG. 21A illustrates an AI system 4041A in which the AI systems 4041 described with FIG. 20 are arranged in parallel and a signal can be transmitted between the systems via a bus line.

The AI system 4041A illustrated in FIG. 21A includes a plurality of AI systems 4041_1 to 4041_n (n is a natural number). The AI system 4041_1 to the AI system 4041_n are connected to each other via a bus line 4098.

Figure 21B:
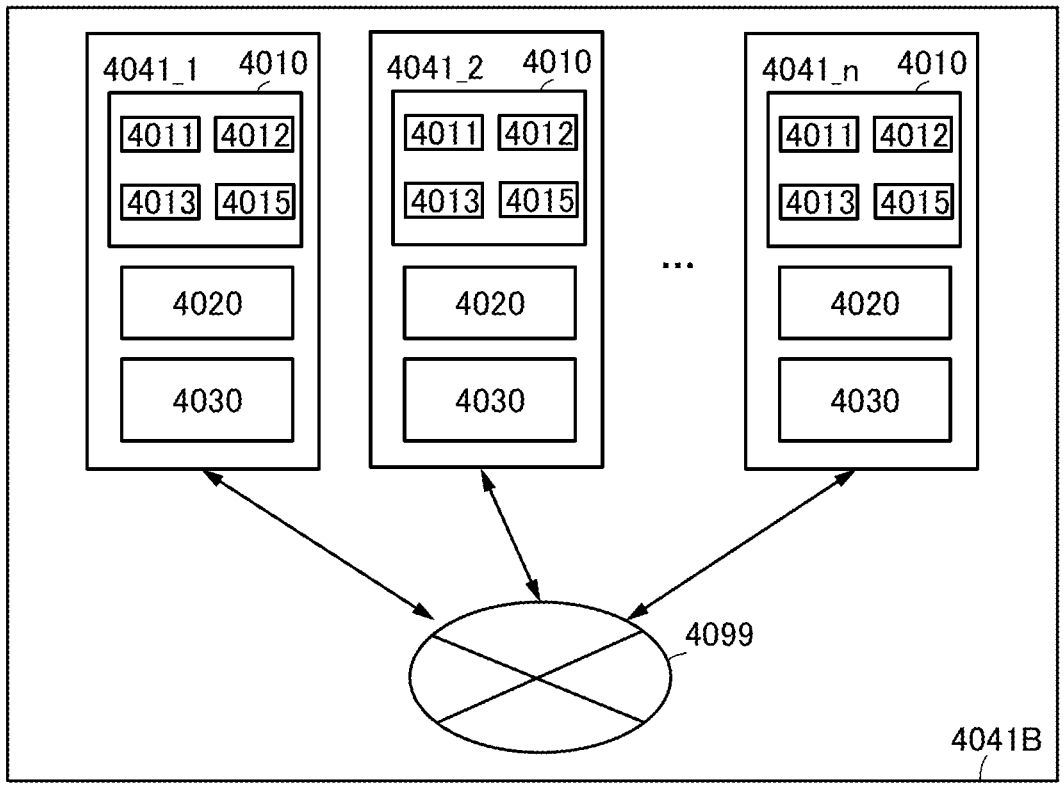

FIG. 21B illustrates an AI system 4041B in which the AI systems 4041 described with FIG. 20 are arranged in parallel as in FIG. 21A and a signal can be transmitted between the systems via a network.

The AI system 4041B illustrated in FIG. 21B includes the plurality of AI systems 4041_1 to 4041_n. The AI system 4041_1 to the AI system 4041_n are connected to each other via a network 4099.

A communication module is provided in each of the AI system 4041_1 to the AI system 4041_n; such a configuration enables wireless or wired communication via the network 4099. A communication module can communicate via an antenna.

Communication can be performed when an AI system is connected to a computer network such as the Internet that is infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network), for example. In the case of performing wireless communication, it is possible to use, as a communication protocol or a communication technology, a communications standard such as LTE (Long-Term Evolution), GSM (Global System for Mobile Communication: registered trademark), EDGE (Enhanced Data Rates for GSM Evolution), CDMA2000 (Code Division Multiple Access 2000), or W-CDMA (registered trademark), or a communications standard developed by IEEE such as Wi-Fi (registered trademark), Bluetooth (registered trademark), or ZigBee (registered trademark).

With the configuration illustrated in FIG. 21A or FIG. 21B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning requires a smaller amount of arithmetic processing. As a result, recognition accuracy can be increased. The information obtained with each AI system is expected to enable instant understanding of collective biological information that irregularly changes.

The structure described in this embodiment can be used in appropriate combination with the structures described in the other embodiments.

Embodiment 5

In this embodiment, an example of an IC into which the AI system described in the above embodiment is incorporated will be described.

In the AI system described in the above embodiment, a digital processing circuit such as a CPU that includes a Si transistor, an analog arithmetic circuit that uses an OS transistor, a 3D-NAND, an OS-FPGA, and an OS memory such as a DOSRAM or a NOSRAM can be integrated into one die.

Figure 9A:
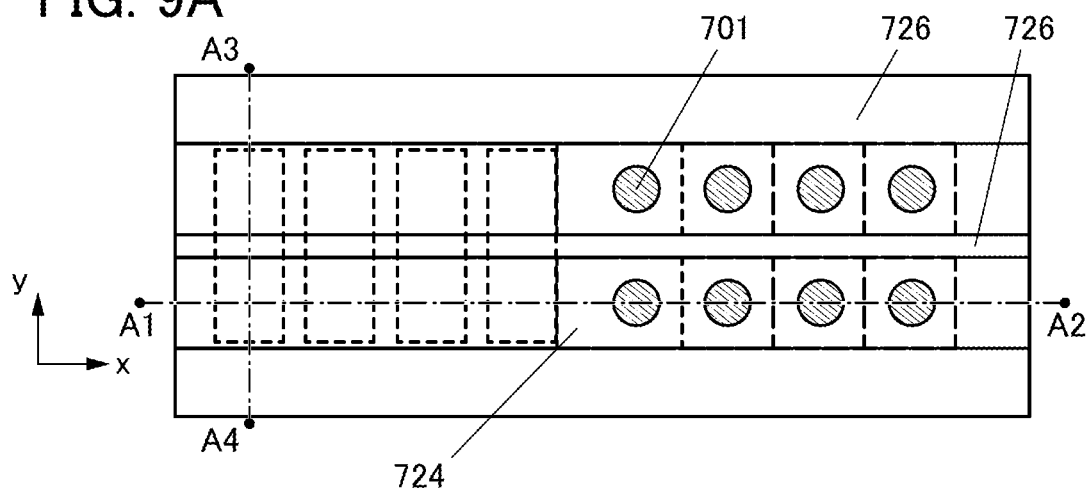
FIGS. 9A to 9C are top view and cross-sectional views illustrating a process of fabricating a semiconductor device according to one embodiment of the present invention.
Figure 9B:
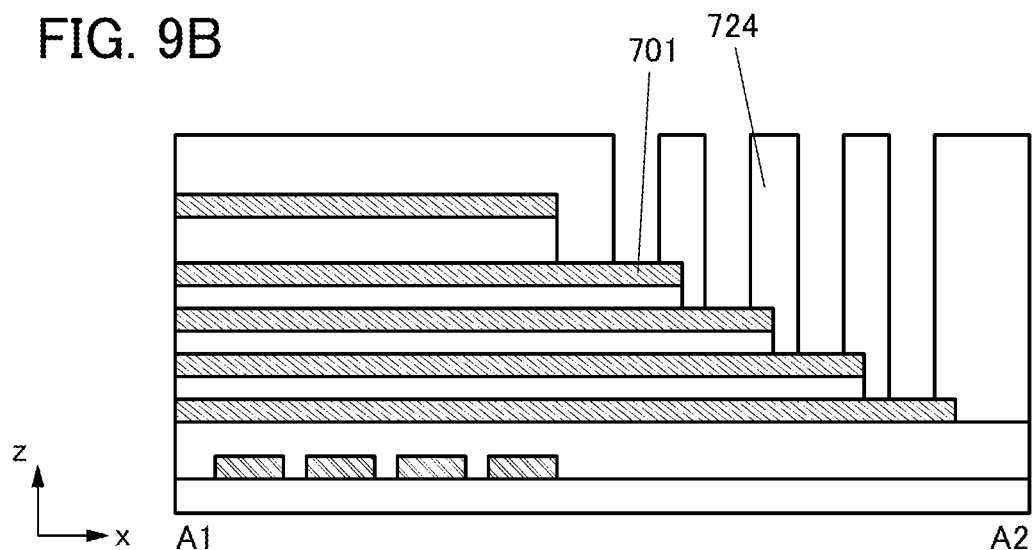
Figure 9C:
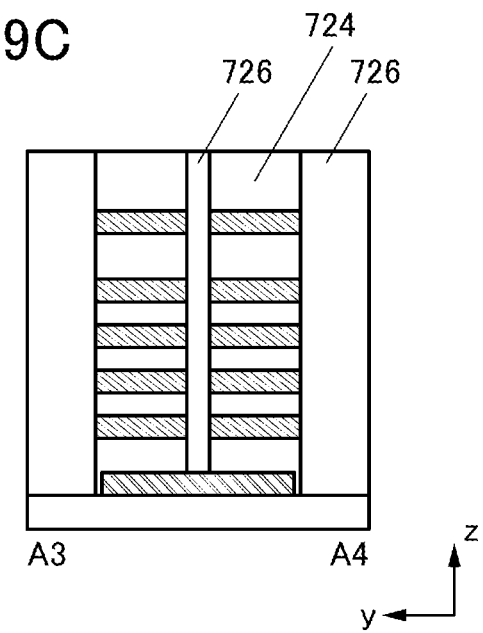
Figure 22:
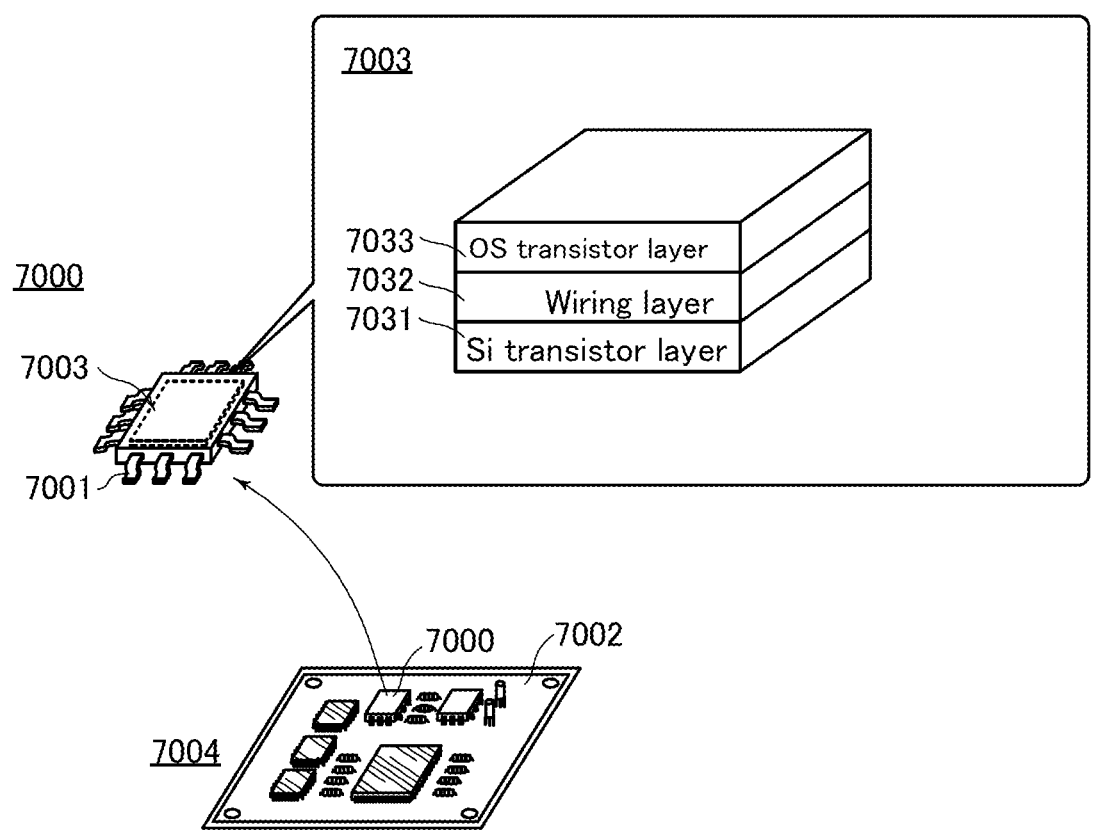
FIG. 22 is a schematic perspective view illustrating a structure example of an IC equipped with an AI system according to one embodiment of the present invention.

FIG. 22 illustrates the example of the IC into which the AI system is incorporated. An AI system IC 7000 illustrated in FIG. 22 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the circuits described in the above embodiment are provided on one die. The circuit portion 7003 has a stacked-layer structure as illustrated in FIGS. 9A to 9C in the above embodiment, and is broadly divided into a Si transistor layer 7031, a wiring layer 7032, and an OS transistor layer 7033. Since the OS transistor layer 7033 can be stacked over the Si transistor layer 7031, the size of the AI system IC 7000 can be easily reduced.

Although a QFP (Quad Flat Package) is used as a package of the AI system IC 7000 in FIG. 22, the embodiment of the package is not limited thereto.

The digital processing circuit such as a CPU, the analog arithmetic circuit that uses an OS transistor, the 3D-NAND, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with the structures described in the other embodiments.

Embodiment 6

Electronic Device

The semiconductor device according to one embodiment of the present invention can be used for a variety of electronic devices. FIGS. 23A and 23B and FIGS. 24A to 24F illustrate specific examples of electronic devices using the semiconductor device according to one embodiment of the present invention.

Figure 23A:
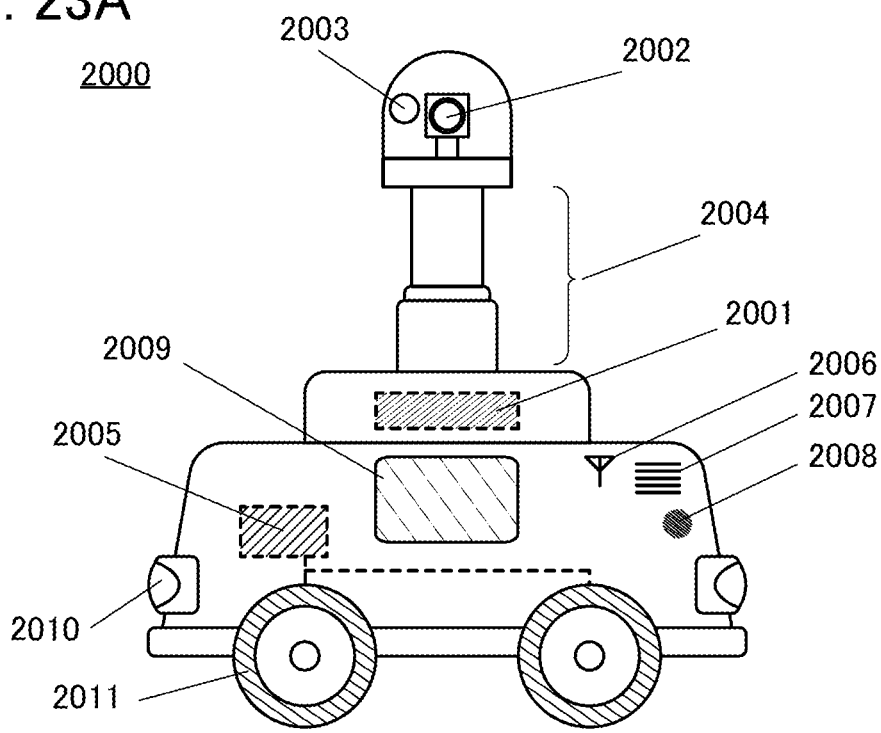
FIGS. 23A and 23B are diagrams illustrating an electronic device according to one embodiment of the present invention.

A robot 2000 illustrated in FIG. 23A includes an arithmetic device 2001, a sensor 2002, a light 2003, a lift 2004, a driver portion 2005, and a moving mechanism 2011, and can take a still image and a moving image while being moved. Such a robot can be used for a security system or a monitoring system.

The robot 2000 may further include a communication means 2006, a speaker 2007, a microphone 2008, a display portion 2009, a light-emitting portion 2010, and the like.

For the arithmetic device 2001, the semiconductor device according to one embodiment of the present invention can be used. In the arithmetic device 2001, an IC in which the AI system according to one embodiment of the present invention is incorporated can be used. The sensor 2002 has a function of a camera which takes images of surroundings of the robot 2000. The light 2003 can be used as a light when the images of the surroundings of the robot 2000 are taken by the sensor 2002. When a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2000 is provided with the driver portion 2005 and the moving mechanism 2011 connected to the driver portion 2005 and thus an imaging range of the sensor 2002, that is, a monitoring range, is expanded, which is preferred.

The communication means 2006 can send information whose image is taken by the sensor 2002 to a manager or the server owned by the manager. When the occurrence of an emergency such as a crime, an accident, or a fire is judged after the arithmetic device 2001 analyzes the information whose image is taken by the sensor 2002, communication to a security company, the police, fire fighting, a medical institution, or the owner of the land or the building is possible. The speaker 2007 can transmit information such as an alert to a criminal, a call to an injured person or an emergency patient, and evacuation guidance, to the surroundings of the robot. The microphone 2008 can be used to obtain sounds around the robot 2000. When used together with the communication means 2006 and the speaker 2007, the robot 2000 can have a function as a telephone. A person around the robot 2000 can have a conversation with the manager or a given person. The display portion 2009 can display given information. In emergency, the disaster information and the evacuation route can be displayed. When used together with the communication means 2006, the speaker 2007, and the microphone 2008, the robot 2000 can have a function as a videophone. A person around the robot 2000 can have a conversation with the manager or a given person while seeing the display portion 2009.

The light-emitting portion 2010 can show the direction of movement and the stopped state of the robot 2000 with characters or light. Emergency may be notified with characters or light.

Figure 23B:
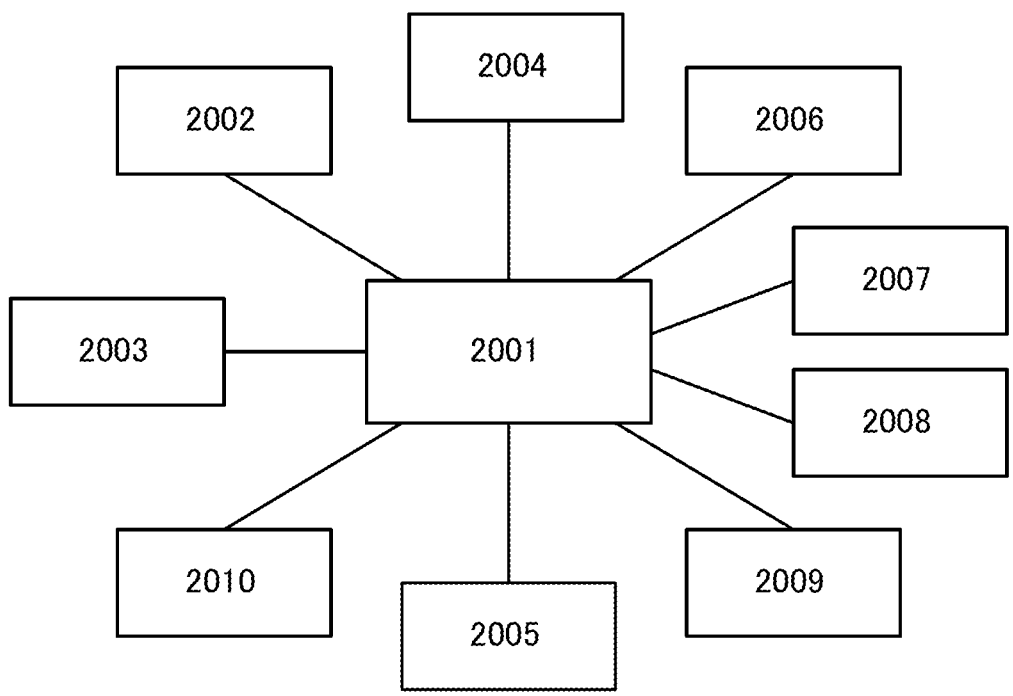

FIG. 23B is a block diagram illustrating a configuration of the robot 2000. The arithmetic device 2001 adjusts turning on or off and the brightness of the light 2003 from information such as an image obtained by the sensor 2002. In addition, the height of the lift 2004 is adjusted or the driver portion 2005 is controlled to align the positions of the robot 2000 and the sensor 2002. The operating condition of the driver portion 2005 can be shown by using the light-emitting portion 2010. With the communication means 2006, information around the robot 2000 obtained from the sensor 2002 and the microphone 2008 can be transmitted to the manager or the server owned by the manager. Depending on the judgement of the arithmetic device 2001 or the manager, information can be sent to the surroundings of the robot 2000 with the speaker 2007 and the display portion 2009.

In the case where a sensor that can take an image even in dark surroundings is used as a sensor used as the sensor 2002, the light 2003 is not necessarily provided. As such a sensor, an image sensor using selenium (Se) in the light receiving portion can be used.

The robot 2000 as described above can be used in commercial facilities and for security of offices. Information obtained from the sensor 2002 and the microphone 2008 is stored in the arithmetic device 2001 or the server. The stored information is analyzed by the AI system to check whether there is an abnormality such as a loss or a damage of an object, entry of a suspicious individual, or a disaster such as a fire. For the information analysis, deep learning may be used. When the occurrence of an abnormality is judged, the robot 2000 performs report to the manager and transmits information to the surroundings, and records the conditions of the surroundings.

The robot 2000 may be used to monitor the growing conditions of crops. The robot 2000 placed in a rice field or a field monitors the shapes, the sizes, or the colors of leaves or fruit with the sensor 2002 to check whether the crops are damaged or not or whether the crops are harmed by pests or not. Since the moving mechanism 2011 is provided for the robot 2000, the growing conditions of the crops can be monitored in a wide range. Since the robot 2000 is provided with the lift 2004, the leaves and fruit at any height can be monitored regardless of the kind of crops and the growing conditions. The monitoring results are sent to a producer using the communication means 2006, and the producer can determine the kind, the amount, and the spraying timing of fertilizer and agricultural chemicals necessary for the crops. The monitoring results may be analyzed with the AI system using the arithmetic device 2001, and the kind, the amount, and the spraying timing of fertilizer and agricultural chemicals necessary for the crops may be determined and reported to the producer. Deep learning may be used for analysis of the monitoring results.

Figure 24A:
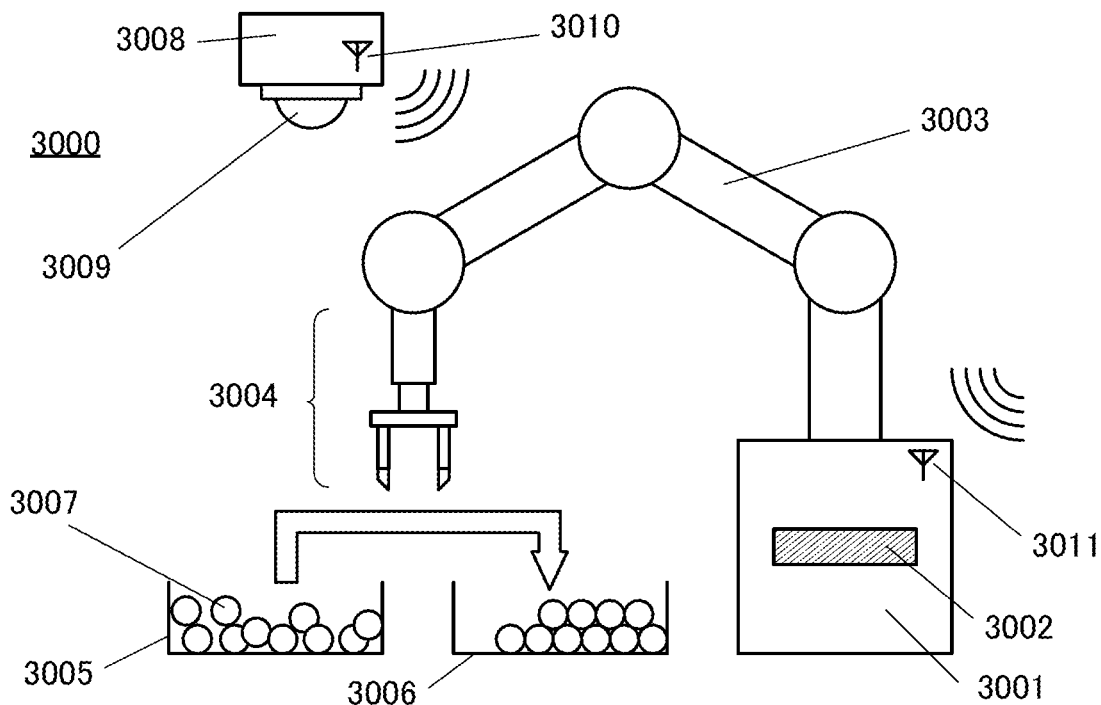
FIGS. 24A to 24F are diagrams illustrating electronic devices according to one embodiment of the present invention.

FIG. 24A illustrates a sorting system 3000 using a robot 3001. The robot 3001 includes an arithmetic device 3002, a boom 3003, and an arm 3004. The robot 3001 may further include a wired or wireless communication means 3011. In addition, the sorting system 3000 includes a housing 3008 including a sensor 3009. The housing 3008 includes a communication means 3010. The housing 3008 is provided for a ceiling, a wall, or a beam (not illustrated) of the sorting system 3000 or a sorting operation area. The housing 3008 may be provided in the robot 3001. For example, the housing 3008 may be provided for the boom 3003 or the arm 3004. In the case where the housing 3008 is provided in the robot 3001, information obtained by the sensor 3009 may be sent to the arithmetic device 3002 without passing through the communication means 3010 and the communication means 3011, and processed.

The boom 3003 is movable, whereby the arm 3004 can be placed at a desired position. The arm 3004 may be telescopic. The arm 3004 placed over a desired object 3007 may be stretched to grab the desired object 3007, shortened, and then moved by the boom 3003.

The sorting system 3000 can transfer the object 3007 in a receptacle 3005 to a receptacle 3006. The receptacle 3005 and the receptacle 3006 may have the same shape or different shapes. Furthermore, a plurality of objects 3007 put in one receptacle 3005 may be moved separately to a plurality of receptacles 3006.

As the receptacle 3005 and the receptacle 3006, a container, a cardboard box, a box for packing a product, a case, a film, a bag, a tray for storing foods, a lunch box, or the like is used. At least one of the receptacle 3005 and the receptacle 3006 may be cooking utensils such as a pot or a frying pan.

For the arithmetic device 3002, the semiconductor device according to one embodiment of the present invention can be used. In the arithmetic device 3002, an IC in which the AI system according to one embodiment of the present invention is incorporated can be used.

The sensor 3009 reads out the position of the receptacle 3005, the position of the receptacle 3006, the state of the inside of the receptacle 3005, and the state of the object 3007 in the receptacle 3005 and transmits the information to the arithmetic device 3002 using the communication means 3010. The information is transmitted with or without a wire. The information may be transmitted through a wire without the communication means 3010. The arithmetic device 3002 analyzes the transmitted information. Here, the state of the object 3007 indicates the shape or the number of the objects 3007, the overlap between the objects 3007, or the like. The arithmetic device 3002 performs analyzation on the basis of information from the sensor 3009 and derives detailed information on the object 3007. The three-dimensional shape and hardness (or softness) of the object 3007 are derived by comparison with the data stored in the arithmetic device 3002 or the server that can be communicated with the robot 3001. Depending on the three-dimensional shape and hardness (or softness) of the object 3007, the shape of the arm 3004 can be changed.

To derive the detailed information on the object 3007, analysis using the AI system can be utilized. For the information analysis, deep learning may be used.

Figure 24B:
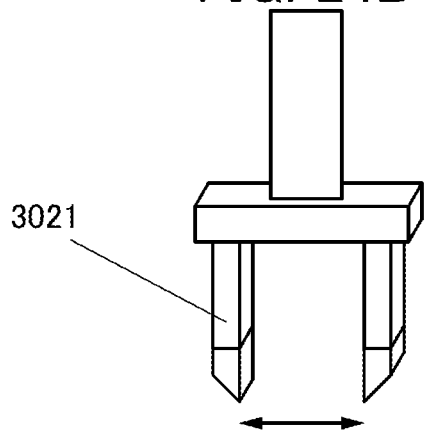
Figure 24C:
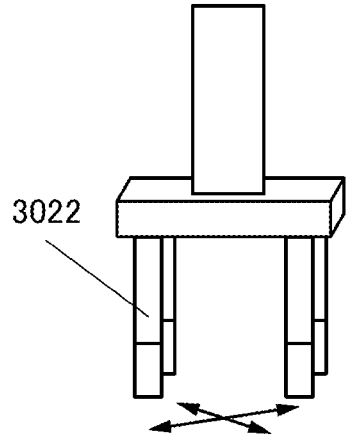
Figure 24D:
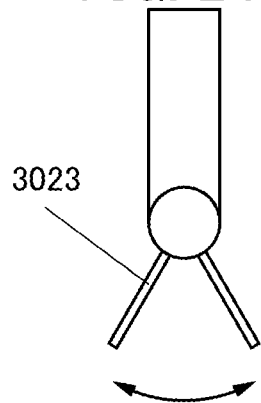
Figure 24E:
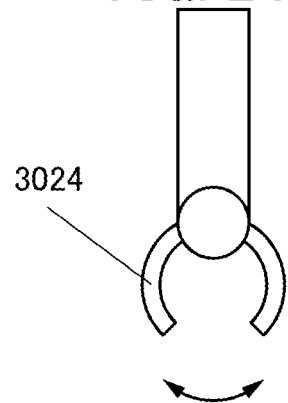
Figure 24F:
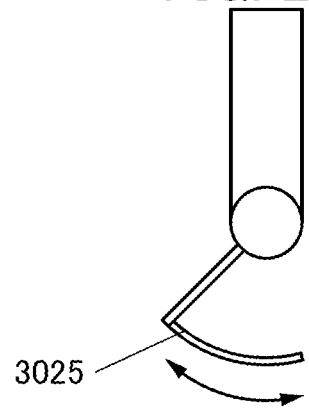

FIG. 24B is an arm in which a pair of plates 3021 can move in the horizontal direction to pinch the object 3007. The pair of plates 3021 moves toward the center horizontally, whereby the object 3007 can be pinched. Such an arm can hold a surface of the object 3007, and is suitable for picking up the object 3007 with a columnar shape, such as a cube or a rectangular solid. FIG. 24C is an arm in which a plurality of bars 3022 can move in the horizontal direction to pinch the object 3007. The plurality of bars 3022 move toward the center horizontally, whereby the object 3007 can be pinched. Such an arm can pinch a point of the object 3007, and is suitable for picking up the object 3007 in a spherical shape or in a non-fixed shape, that is, the object 3007 in an irregular shape. Although the number of the bars 3022 is four in FIG. 24C, this embodiment is not limited to this. The number of the bars 3022 may be three or five or more. FIG. 24D is an arm in which a pair of plates 3023 rotates around the common axis to be closer to each other to pinch the object 3007. Such an arm can hold a surface of the object 3007, and is suitable for picking up the object 3007 with a thin-film shape, such as paper or films. FIG. 24E is an arm in which a pair of crook-shaped plates 3024 rotates around the common axis such that the ends of them are closer to each other to pick up the object 3007. Such an arm can pinch a point or a side of the object 3007, and is suitable for picking up the object 3007 with a thin-film shape, such as paper or films or the object 3007 with a smaller particulate shape. As illustrated in FIG. 24F, a spatula 3025 may be attached to the tip of the arm, and the object 3007 with a smaller particulate shape may be scooped.

The arms illustrated in FIG. 24A to FIG. 24F are just examples and one embodiment of the present invention is not limited to these shapes. In addition, the application of the arms is just an example and one embodiment of the present invention is not limited thereto.

The robot 3001 moves the boom 3003 to move the arm 3004 to a position over the desired object 3007 in the receptacle 3005 on the basis of signals from the arithmetic device 3002. In the case of the telescopic arm 3004, the arm 3004 is stretched, and the tip of the arm 3004 is brought down to a position on the same level as the object 3007. The tip of the arm is moved to catch the desired object 3007. The arm is shortened while catching the object 3007. The boom 3003 is moved again to transfer the arm 3004 to the desired position in the receptacle 3006. At this time, the arm 3004 may be rotated to adjust the angle of the object 3007 to the receptacle 3006. The arm 3004 is stretched to place the object 3007 in the receptacle 3006, and the arm 3004 releases the object 3007. The above operation is repeated, so that the robot 3001 can move the objects 3007 from the receptacle 3005 to the receptacle 3006.

Since the positional information on the receptacle 3005 and the receptacle 3006 and the state of the object 3007 are analyzed using the AI system, the object 3007 can be moved surely regardless of the shape or hardness of the object 3007. Examples of the object 3007 include not only an object packed in a box with a shape of a cube or a rectangular solid or a box or a case with a given shape but also shaped processed foods such as an egg, a hamburger steak, and a croquette, foods such as vegetables with an irregular shape such as a potato and a tomato, machine parts such as a screw and a nut, a thin film of a paper or a film, and the like. Since in the sorting system 3000 described in this embodiment, the shape of the arm can be changed in consideration of the shape and the hardness of the object 3007, the objects 3007 given above as examples can be transferred from the receptacle 3005 to the receptacle 3006 regardless of the shape and the hardness.

For example, a memory device using the semiconductor device of one embodiment of the present invention can retain control data, a control program, or the like of the above-described electronic device for a long time. With the use of the semiconductor device according to one embodiment of the present invention, a highly reliable electronic device can be achieved.

An IC in which the above AI system is incorporated can be used for the arithmetic device or the like of the above-described electronic device, for example. Accordingly, the electronic device described in this embodiment can perform accurate operations depending on circumstances with low power consumption by utilizing the AI system.

This embodiment can be implemented in an appropriate combination with the configurations described in the other embodiments.

REFERENCE NUMERALS

100: memory device, 105: control circuit, 110: memory cell array, 112: memory string, 121: row decoder, 122: row driver, 123: sense amplifier, 124: source line driver, 125: input/output circuit, 700: memory cell array, 700A: memory cell array, 701: conductor, 701_$m$: conductor, 701_1: conductor, 7016: conductor, 701$a$: conductor, 701A: conductive film, 701$b$: conductor, 701B: conductive film, 702: conductor, 702A: conductive film, 702$b$: insulator, 702B: conductive film, 703: insulator, 703_1: insulator, 7034: insulator, 703$a$: insulator, 703A: insulating film, 703$b$: insulator, 703$c$: insulator, 704: oxide, 704_1: oxide, 704_4: oxide, 704$a$: oxide, 704$b$: oxide, 704$c$: oxide, 705: conductor, 7051: conductor, 7054: conductor, 706: conductor, 706_1: conductor, 7064: conductor, 707: conductor, 707_$m$: conductor, 707_1: conductor, 708: conductor, 708_$m$: conductor, 708_1: conductor, 710: memory transistor, 711: insulator, 720: base, 721: insulating film, 722: insulator, 722A: insulating film, 722B: insulating film, 723: mask, 723A: mask, 724: insulating film, 725: mask, 726: insulator, 727: material, 728: region, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 2000: CDMA, 2000: robot, 2001: arithmetic device, 2002: sensor, 2003: light, 2004: lift, 2005: driver portion, 2006: communication means, 2007: speaker, 2008: microphone, 2009: display portion, 2010: light-emitting portion, 2011: moving mechanism, 3000: system, 3001: robot, 3002: arithmetic device, 3003: boom, 3004: arm, 3005: receptacle, 3006: receptacle, 3007: object, 3008: housing, 3009: sensor, 3010: communication means, 3011: communication means, 3021: plate, 3022: bar, 3023: plate, 3024: plate, 3025: spatula, 4010: arithmetic portion, 4011: analog arithmetic circuit, 4012: DOSRAM, 4013: NOSRAM, 4014: FPGA, 4015: 3D-NAND, 4020: control portion, 4021: CPU, 4022: GPU, 4023: PLL, 4024: SRAM, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041$n$: AI system, 4041_1: AI system, 4041A: AI system, 4041B: AI system, 4098: bus line, 4099: network, 7000: AI system IC, 7001: lead, 7002: printed board, 7003: circuit portion, 7004: circuit board, 7031: Si transistor layer, 7032: wiring layer, 7033: OS transistor layer

The invention claimed is:

1. A semiconductor device comprising a memory cell array, the memory cell array comprising:
   a first conductor over a base;
   a first transistor over the first conductor, the first transistor comprising:
   a second conductor comprising a first opening;
   a first part of an insulator provided in contact with an inner side of the first opening; and
   a first part of an oxide provided in contact with an inner side of the first part of the insulator; and
   a second transistor stacked over the first transistor, the second transistor comprising:
   a third conductor comprising a second opening;
   a second part of the insulator provided in contact with an inner side of the second opening; and
   a second part of the oxide provided in contact with an inner side of the second part of the insulator,
   wherein the oxide comprises In, an element M, and Zn,
   wherein the element M is at least one of Al, Ga, Y, and Sn, and
   wherein the first part of the insulator is thicker than the second part of the insulator.

2. The semiconductor device according to claim 1,
   wherein the first part of the insulator includes at least a first part of a first insulator and a first part of a second insulator, and
   wherein the second part of the insulator includes a second part of the first insulator.

3. The semiconductor device according to claim 1,
   wherein the first transistor is a memory transistor, and
   wherein the second transistor is a selection transistor.

4. The semiconductor device according to claim 1,
   wherein the insulator comprises an oxide comprising any one of silicon, aluminum, and hafnium.

5. A semiconductor device comprising a memory cell array, the memory cell array comprising:
   a first conductor over a base;
   a first transistor over the first conductor, the first transistor comprising:
   a second conductor comprising a first opening;
   a first insulator, a first part of the first insulator provided in contact with an inner side of the first opening;

a second insulator, a first part of the second insulator provided in contact with an inner side of the first part of the first insulator;

a third insulator, a first part of the third insulator provided in contact with an inner side of the first part of the second insulator;

a first oxide, a first part of the first oxide provided in contact with an inner side of the first part of the third insulator; and a second oxide, a first part of the second oxide provided in contact with an inner side of the first part of the first oxide; and a second transistor stacked over the first transistor, the second transistor comprising:

a third conductor comprising a second opening;

the first insulator, a second part of the first insulator provided in contact with an inner side of the second opening;

the first oxide, a second part of the first oxide provided in contact with an inner side of the second part of the first insulator; and the second oxide, a second part of the second oxide provided in contact with an inner side of the second part of the first oxide, wherein each of the first oxide and the second oxide comprises In, an element M, and Zn, wherein the element M is at least one of Al, Ga, Y, and Sn, wherein the element M for the first oxide and the element M of the second oxide are the same.

6. The semiconductor device according to claim 5, wherein the first transistor further comprises a third oxide, and wherein a first part of the third oxide is provided in contact with an inner side of the first part of the second oxide.

7. The semiconductor device according to claim 5, wherein an atomic ratio of In in the second oxide is greater than an atomic ratio of the element M in the second oxide.

8. The semiconductor device according to claim 5, wherein an atomic ratio of the element M to In in the first oxide is greater than an atomic ratio of the element M to In in the second oxide.

9. The semiconductor device according to claim 5, wherein the first transistor is a memory transistor, and wherein the second transistor is a selection transistor.

10. The semiconductor device according to claim 5, wherein at least one of the first insulator and the third insulator comprises an oxide comprising any one of silicon, aluminum, and hafnium.

11. The semiconductor device according to claim 5, wherein the third insulator is thinner than the first insulator.

12. The semiconductor device according to claim 5, wherein lower end portions of the first oxide and the second oxide are in contact with the first conductor.

13. A semiconductor device comprising a memory cell array, the memory cell array comprising:

a first conductor over a base;

a plurality of first transistors stacked over the first conductor, one of the plurality of first transistors comprising:

a second conductor comprising a first opening;

a first insulator, a first part of the first insulator provided in contact with an inner side of the first opening;

a second insulator, a first part of the second insulator provided in contact with an inner side of the first part of the first insulator;

a third insulator, a first part of the third insulator provided in contact with an inner side of the first part of the second insulator;

a first oxide, a first part of the first oxide provided in contact with an inner side of the first part of the third insulator; and a second oxide, a first part of the second oxide provided in contact with an inner side of the first part of the first oxide; and a second transistor stacked over the plurality of first transistors, the second transistor comprising:

a third conductor comprising a second opening;

the first insulator, a second part of the first insulator provided in contact with an inner side of the second opening;

the first oxide, a second part of the first oxide provided in contact with an inner side of the second part of the first insulator; and the second oxide, a second part of the second oxide provided in contact with an inner side of the second part of the first oxide, wherein each of the first oxide and the second oxide comprises In, an element M, and Zn, wherein the element M is at least one of Al, Ga, Y, and Sn, and wherein the element M for the first oxide and the element M of the second oxide are the same.

14. The semiconductor device according to claim 13, wherein the one of the plurality of first transistors further comprises a third oxide, and wherein a first part of the third oxide is provided in contact with an inner side of the first part of the second oxide.

15. The semiconductor device according to claim 13, wherein an atomic ratio of In in the second oxide is greater than an atomic ratio of the element M in the second oxide.

16. The semiconductor device according to claim 13, wherein an atomic ratio of the element M to In in the first oxide is greater than an atomic ratio of the element M to In in the second oxide.

17. The semiconductor device according to claim 13, wherein the plurality of first transistors are memory transistors, and wherein the second transistor is a selection transistor.

18. The semiconductor device according to claim 13, wherein at least one of the first insulator and the third insulator comprises an oxide comprising any one of silicon, aluminum, and hafnium.

19. The semiconductor device according to claim 13, wherein the third insulator is thinner than the first insulator.

20. The semiconductor device according to claim 13, wherein lower end portions of the first oxide and the second oxide are in contact with the first conductor.

* * * * *